(12) United States Patent
Kadotani et al.

(10) Patent No.: US 11,448,947 B2
(45) Date of Patent: Sep. 20, 2022

(54) WAVELENGTH CONVERSION DEVICE, ILLUMINATION DEVICE, AND PROJECTOR

(71) Applicant: SEIKO EPSON CORPORATION, Tokyo (JP)

(72) Inventors: Norikazu Kadotani, Azumino (JP); Takahiro Miyata, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 31 days.

(21) Appl. No.: 16/827,757

(22) Filed: Mar. 24, 2020

(65) Prior Publication Data
US 2020/0310233 A1    Oct. 1, 2020

(30) Foreign Application Priority Data

Mar. 25, 2019  (JP) .............................. JP2019-056101

(51) Int. Cl.
| | |
|---|---|
| *G03B 21/16* | (2006.01) |
| *G03B 21/20* | (2006.01) |
| *G02B 26/00* | (2006.01) |
| *H05K 7/20* | (2006.01) |

(52) U.S. Cl.
CPC ........... *G03B 21/16* (2013.01); *G02B 26/008* (2013.01); *G03B 21/204* (2013.01); *H05K 7/20154* (2013.01); *H05K 7/20172* (2013.01); *H05K 7/20309* (2013.01); *H05K 7/20318* (2013.01); *H05K 7/20327* (2013.01)

(58) Field of Classification Search
CPC ......... H04N 9/3144; H04N 9/31–3197; G03B 21/16; G03B 21/204; G03B 21/00–64; H05K 7/00–2099
See application file for complete search history.

(56) References Cited

U.S. PATENT DOCUMENTS

| | | | |
|---|---|---|---|
| 2007/0131954 A1* | 6/2007 | Murayama | ............ H01L 33/507 257/E33.061 |
| 2016/0077326 A1* | 3/2016 | Yamagishi | ............. G02B 7/008 353/61 |
| 2016/0348857 A1 | 12/2016 | Miyata | |

(Continued)

FOREIGN PATENT DOCUMENTS

| | | |
|---|---|---|
| JP | 2010-197497 A | 9/2010 |
| JP | 2016-066061 A | 4/2016 |

(Continued)

*Primary Examiner* — Christopher A Lamb, II
(74) *Attorney, Agent, or Firm* — Oliff PLC

(57) ABSTRACT

A wavelength conversion device includes a rotating device, a substrate rotated by the rotating device, a wavelength conversion element, and a first cooling device including, on an inside, a space in which working fluid is encapsulated, the first cooling device cooling the wavelength conversion element. The first cooling device is disposed in a position corresponding to the wavelength conversion element. The space extends from an outer edge side of the substrate to a rotation axis side. The first cooling device includes an evaporator and a condenser which are provided in the space. The evaporator includes a liquid retaining part configured to retain the working fluid in a liquid phase. The liquid retaining part is provided at the outer edge side in the space and disposed in the position corresponding to the wavelength conversion element.

18 Claims, 15 Drawing Sheets

(56) References Cited

U.S. PATENT DOCUMENTS

2017/0328549 A1* 11/2017 Adema ................... F21V 29/56
2020/0109899 A1* 4/2020 Sano .................... G03B 21/204

FOREIGN PATENT DOCUMENTS

| JP | 2017-027685 A | 2/2017 |
| JP | 2017-207673 A | 11/2017 |
| JP | 2018-055054 A | 4/2018 |

* cited by examiner

WAVELENGTH CONVERSION DEVICE, ILLUMINATION DEVICE, AND PROJECTOR

The present application is based on, and claims priority from JP Application Serial Number 2019-056101, filed Mar. 25, 2019, the disclosure of which is hereby incorporated by reference herein in its entirety.

BACKGROUND

1. Technical Field

The present disclosure relates to a wavelength conversion device, an illumination device, and a projector.

2. Related Art

There has been known a wavelength conversion device that converts, using a phosphor, the wavelength of light emitted from a light source of a projector. In such a wavelength conversion device, it is necessary to cool the phosphor and suppress deterioration in wavelength conversion efficiency due to heat generation of the phosphor in order to brighten a projected image projected by the projector and appropriately maintain the white balance of the projected image. Therefore, the phosphor having a ring shape is disposed on a rotating body and turned to sequentially switch an irradiation position of light emitted from a light source in the phosphor. For example, JP A-2016-66061 (Patent Literature 1) discloses a phosphor wheel device including a plurality of vanes in order to efficiently cool a phosphor.

However, the phosphor wheel device described in Patent Literature 1 has a problem in that it is difficult to improve cooling efficiency for the phosphor. Specifically, to further brighten the projected image projected by the projector and improve illumination efficiency, the density of light irradiated on the phosphor has to be increased. When the density of the irradiated light is increased, the phosphor is sometimes not sufficiently cooled by the turning of the phosphor and an air flow by the plurality of vanes. When it is attempted to increase the diameter of the ring-shaped phosphor or the rotating body to improve the cooling efficiency for the phosphor, the phosphor wheel device tends to be increased in size. Therefore, there has been a demand for a wavelength conversion device with improved cooling efficiency for the phosphor from that in the past.

SUMMARY

A wavelength conversion device according to an aspect of the present disclosure includes: a rotating device; a substrate including a first surface and a second surface disposed at an opposite side of the first surface, the substrate being rotated by the rotating device; a wavelength conversion element provided on the first surface and configured to convert a wavelength of incident light; and a first cooling device provided on the second surface, the first cooling device including, on an inside, a space in which working fluid is encapsulated, the first cooling device cooling the wavelength conversion element. The first cooling device is disposed in a position corresponding to the wavelength conversion element. The space extends from an outer edge side of the substrate to a rotation axis side. The first cooling device includes an evaporator provided in the space and configured to evaporate the working fluid in a liquid phase with heat transferred from the wavelength conversion element to change the working fluid in the liquid phase to the working fluid in a gas phase and a condenser provided in the space and configured to condense the working fluid in the gas phase to change the working fluid in the gas phase to the working fluid in the liquid phase. The evaporator includes a liquid retaining part configured to retain the working fluid in the liquid phase. The liquid retaining part is provided at the outer edge side in the space and disposed in the position corresponding to the wavelength conversion element.

In the wavelength conversion device, the first cooling device may be provided along a shape of the wavelength conversion element.

In the wavelength conversion device, the liquid retaining part may not be provided at an end portion on the rotation axis side in the space.

In the wavelength conversion device, a direction from the first surface toward the second surface along the rotation axis is a first direction, and the first cooling device may include, in a part located in the first direction, an inclined surface inclined such that length of the space along the first direction increases from the outer edge side toward the rotation axis side.

In the wavelength conversion device, a direction from the first surface toward the second surface along the rotation axis is a first direction, and the first cooling device may include, in a part located in the first direction, a plurality of fins disposed along a rotating direction of the substrate, and a plurality of grooves may be radially provided in the plurality of fins from the rotation axis side toward the outer edge side.

In the wavelength conversion device, a plurality of the first cooling devices may be provided, and the plurality of first cooling devices may respectively extend from the rotation axis side to the outer edge side.

In the wavelength conversion device, the plurality of first cooling devices may be bent.

In the wavelength conversion device, end portions at the rotation axis side of the plurality of first cooling devices may be bent in a direction away from the substrate.

The wavelength conversion device may further include: a first heat transfer member coupled to a position corresponding to the evaporators in the plurality of first cooling devices; and a second heat transfer member coupled to parts at the rotation axis side in the plurality of first cooling devices.

The wavelength conversion device may further include a cooling fin disposed in the second heat transfer member.

In the wavelength conversion device, the first cooling device may include a cooling fin.

The wavelength conversion device may further include a second cooling device provided on the first surface, the second cooling device including, on an inside, a space in which the working fluid is encapsulated. The second cooling device may include an evaporator provided in the space and configured to evaporate the working fluid in the liquid phase with the heat transferred from the wavelength conversion element to change the working fluid in the liquid phase to the working fluid in the gas phase and a condenser provided in the space and configured to condense the working fluid in the gas phase to change the working fluid in the gas phase to the working fluid in the liquid phase. The second cooling device may be disposed such that the evaporator of the second cooling device corresponds to a part on the rotation axis side of the first cooling device.

In the wavelength conversion device, the second cooling device may be disposed at the rotation axis side with respect to the wavelength conversion element.

In the wavelength conversion device, at least one of the first cooling device and the second cooling device may include a cooling fin.

An illumination device according to an aspect of the present disclosure includes: a light source configured to emit light having a first wavelength band; and the wavelength conversion device configured to convert a wavelength of the light emitted from the light source into a second wavelength band different from the first wavelength band.

A projector according to an aspect of the present disclosure includes: the illumination device; a light modulator configured to modulate light emitted from the illumination device; and a projection optical device configured to project the light modulated by the light modulator.

The projector may further include a cooling fan configured to blow air to the first cooling device.

DESCRIPTION OF EXEMPLARY EMBODIMENTS

Embodiments of the present disclosure are explained below with reference to the drawings. The embodiments explained below explain examples of the present disclosure. The present disclosure is not limited to the embodiments explained below and includes various modifications implemented in a range in which the gist of the present disclosure is not changed. In the figures referred to below, the scales of members are differentiated from actual scales in order to show the members in recognizable sizes.

1. First Embodiment 1.1. Schematic Configuration of a Projector

Figure 1:
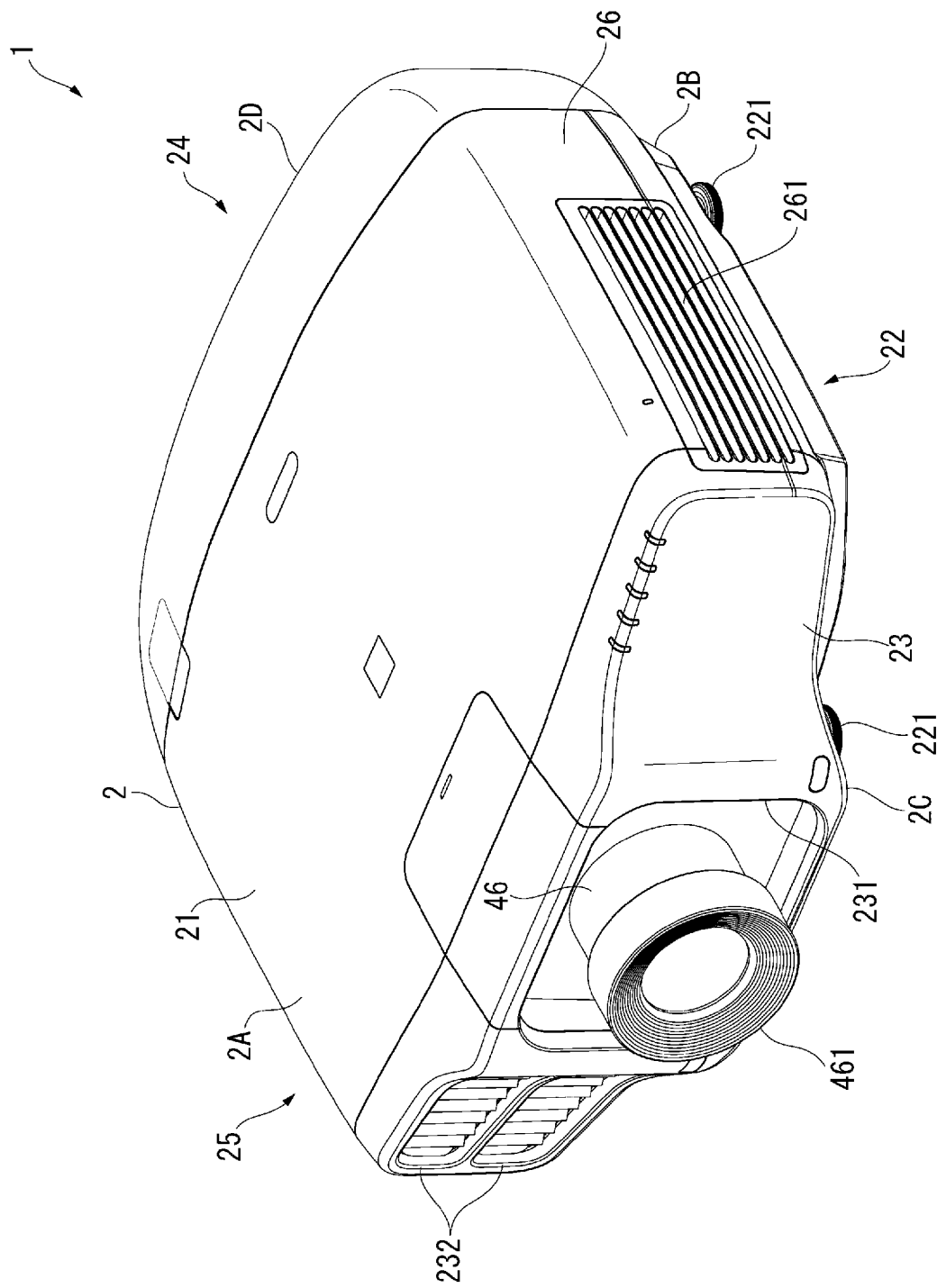
FIG. 1 is a perspective view showing the appearance of a projector according to the first embodiment.
Figure 2:
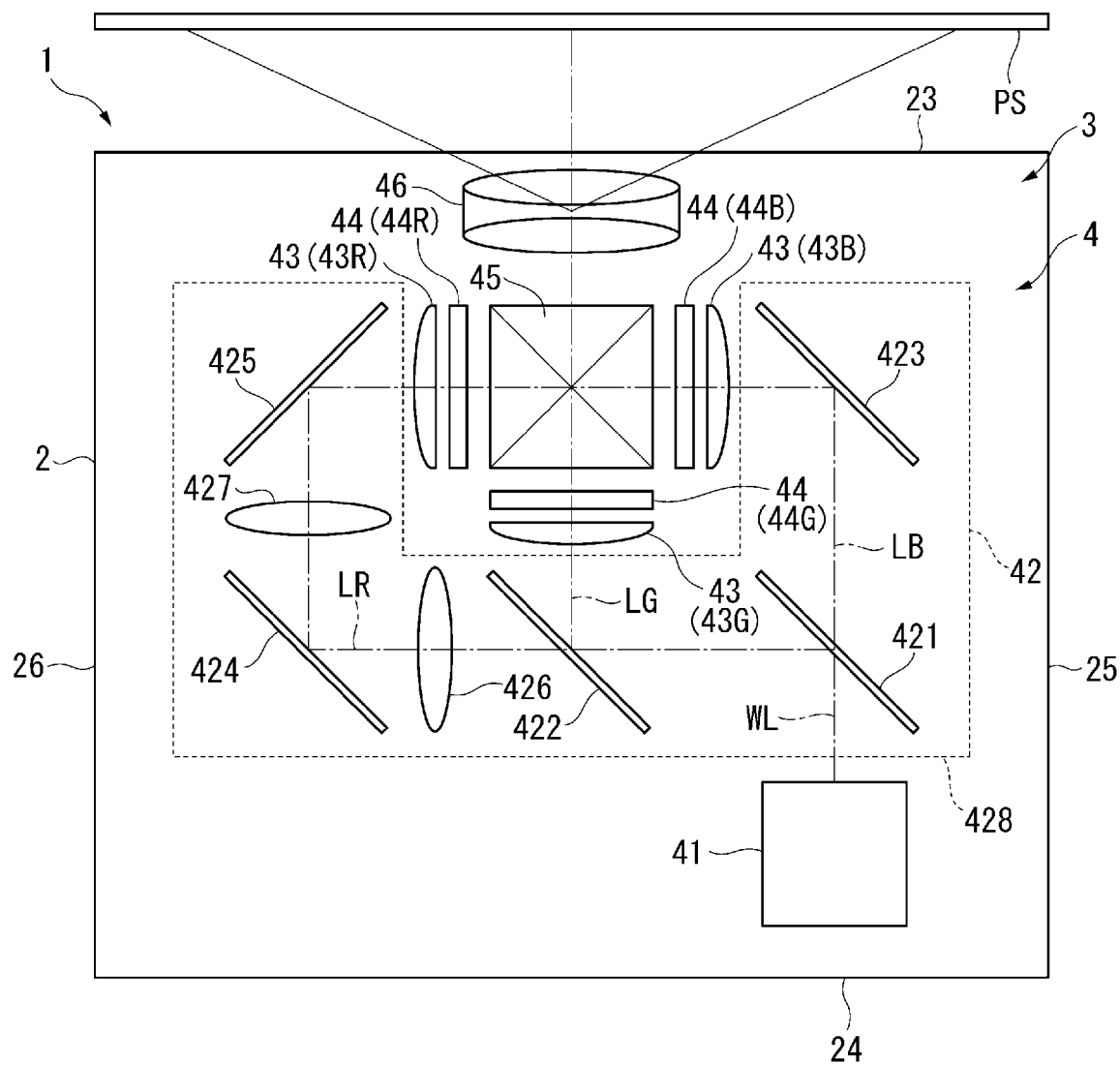
FIG. 2 is a schematic diagram showing an internal configuration of the projector.
Figure 3:
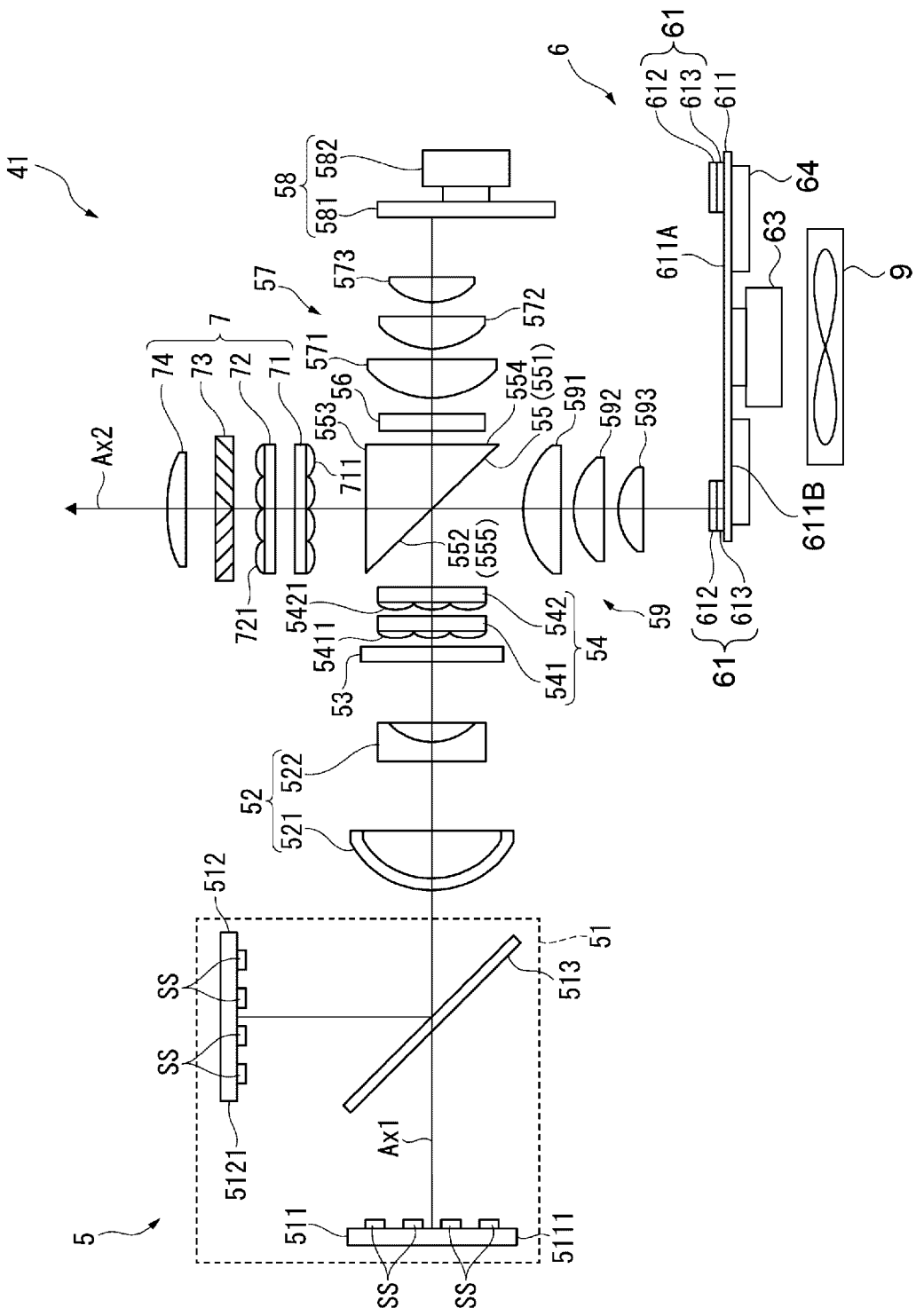
FIG. 3 is a schematic diagram showing the configuration of an illumination device.

The configuration of a projector 1 according to a first embodiment is explained with reference to FIGS. 1, 2, and 3. FIG. 1 is a perspective view showing the appearance of the projector 1 according to the first embodiment. FIG. 2 is a schematic diagram showing an internal configuration of the projector 1. FIG. 3 is a schematic diagram showing the configuration of an illumination device 41.

The projector 1 according to this embodiment is a projection-type image display apparatus that modulates light emitted from a light source device 5 explained below, forms an image corresponding to image information, and enlarges and projects the formed image onto a projection surface PS explained below such as a screen. The projector 1 includes, as shown in FIG. 1, an exterior housing 2 forming an appearance and an apparatus main body 3 explained below.

1.1.1. Configuration of the Exterior Housing

The exterior housing 2 is formed in a substantially rectangular parallelepiped shape by combining an upper case 2A, a lower case 2B, a front case 2C, and a rear case 2D. The exterior housing 2 includes a top surface 21, a bottom surface 22, a front surface 23, a rear surface 24, a left side surface 25, and a right side surface 26.

Legs 221 in contact with a placement surface when the projector 1 is placed on the placement surface are provided in a plurality of places on the bottom surface 22. In FIG. 1, only two legs 221 are shown.

In the center portion of the front surface 23, an opening 231, which exposes an end portion 461 of a projection optical device 46 explained below and through which an image projected by the projection optical device 46 passes, is formed. An exhaust port 232, from which cooling gas in the exterior housing 2 is discharged, is formed in a position on the left side surface 25 side in the front surface 23. An introducing port 261 for introducing outside air into the inside as the cooling gas is formed in the right side surface 26.

1.1.2. Configuration of the Apparatus Main Body

As shown in FIG. 2, the apparatus main body 3 is housed in the exterior housing 2. Besides including the image projection device 4, the apparatus main body 3 includes, although not shown in FIG. 2, a control device that controls the operation of the projector 1, a power supply device that supplies electric power to electronic components configuring the projector 1, and a cooling device that cools a cooling target.

1.1.3. Configuration of the Image Projection Device

The image projection device 4 forms an image corresponding to an image signal input from the control device and projects the image onto the projection surface PS. The image projection device 4 includes an illumination device 41, a color separation device 42, collimating lenses 43, light modulators 44 that modulate light emitted from the illumination device 41, a color combination device 45, and a projecting optical device 46 that projects the light modulated by the light modulators 44. The illumination device 41 emits illumination light WL that uniformly illuminates the light modulators 44. The illumination device 41 emits the illumination light WL toward the color separation device 42. The configuration of the illumination device 41 is explained below.

The color separation device 42 separates blue light LB, green light LG, and red light LR from the illumination light WL made incident thereon from the illumination device 41. The color separation device 42 includes dichroic mirrors 421 and 422, reflection mirrors 423, 424, and 425, relay lenses 426 and 427, and an optical component housing 428 that houses the foregoing on the inside.

The dichroic mirror 421 transmits the blue light LB included in the illumination light WL and reflects the green light LG and the red light LR included in the illumination light WL. The blue light LB transmitted through the dichroic mirror 421 is reflected by the reflection mirror 423 and guided to a collimating lens 43B for blue light among the collimating lenses 43.

The dichroic mirror 422 reflects the green light LG of the green light LG and the red light LR reflected by the dichroic mirror 421, guides the green light LG to a collimating lens 43G for green light among the collimating lenses 43, and transmits the red light LR. The red light LR is guided to a collimating lens 43R for red light among the collimating lenses 43 by the relay lens 426, the reflection mirror 424, the relay lens 427, and the reflection mirror 425. The collimating lenses 43R, 43G, and 43B for the respective color lights, which are the collimating lenses 43, collimate lights made incident thereon.

The light modulators 44 respectively modulate the color lights LR, LG, and LB made incident thereon and form images based on the color lights LR, LG, and LB corresponding to image signals input from the control device. In the light modulators 44, light modulators for the respective color lights of red, green, and blue are respectively represented by 44R, 44G, and 44B. Each of the light modulators 44 includes, for example, a liquid crystal panel that modulates light made incident thereon and polarizing plates respectively disposed at an incident side and an emission side of the liquid crystal panel. The light modulator is not limited to a transmission-type liquid crystal panel and may be a reflection-type liquid crystal panel, a DMD (Digital Micromirror Device), or the like.

The color combination device 45 combines images based on the color lights LR, LG, and LB made incident thereon from the light modulators 44R, 44G, and 44B to form an image. In this embodiment, the color combination device 45 is configured by a cross dichroic prism. However, the color combination device 45 can also be configured by a plurality of dichroic mirrors.

The projection optical device 46 enlarges and projects the image formed by the color combination device 45 onto projection surface PS. As such a projection optical device 46, for example, a set lens configured by a lens barrel and a plurality of lenses disposed in the lens barrel can be adopted.

1.1.4. Configuration of the Illumination Device

As explained above, the illumination device 41 emits the illumination light WL toward the color separation device 42. The illumination device 41 includes, as shown in FIG. 3, a light source device 5 and an homogenizing device 7.

1.1.5. Configuration of the Light Source Device

The light source device 5 emits the illumination light WL, which is a light beam, to the homogenizing device 7. The light source device 5 includes a light source 51 functioning, an afocal optical element 52, a first phase difference element 53, a homogenizer optical device 54, a light combination device 55, a second phase difference element 56, a first condensing element 57, a light diffusing device 58, a second condensing element 59, and a wavelength conversion device 6.

The light source 51, the afocal optical element 52, the first phase difference element 53, the homogenizer optical device 54, the second phase difference element 56, the first condensing element 57, and the light diffusing device 58 are disposed on a first illumination optical axis Ax1. On the other hand, the second condensing element 59, the wavelength conversion device 6, and the homogenizing device 7 are disposed on a second illumination optical axis Ax2 crossing the first illumination optical axis Ax1. The light combination device 55 is disposed in a crossing portion of the first illumination light optical axis Ax1 and the second illumination optical axis Ax2.

1.1.6. Configuration of the Light Source

The light source 51 is a light emission device that emits excitation light, which is blue light. The light source 51 includes a first light source 511, a second light source 512, and a light combining member 513.

The first light source 511 includes a solid-state light source array 5111 in which a plurality of solid-state light sources SS, which are LDs (Laser Diodes), are arrayed in a matrix shape and a not-shown plurality of collimating lenses corresponding to the solid-state light sources SS. Similarly, the second light source 512 includes a solid-state light source array 5121 in which a plurality of solid-state light sources SS are arrayed in a matrix shape and a not-shown plurality of collimating lenses corresponding to the solid-state light sources SS. The solid-state light sources SS emit, for example, excitation lights having a peak wavelength of 440 nm. In other words, the light source 51 emits light having a first wavelength band. The solid-state light sources SS may emit excitation lights having a peak wavelength of 446 nm and excitation lights having a peak wavelength of 460 nm. Solid-state light sources that respectively emit excitation lights having different peak wavelengths may be mixed in the light sources 511 and 512. The excitation lights emitted from the solid-state light sources SS are collimated by a collimator lens, which is a collimating lens, and made incident on the light combining member 513.

In this embodiment, the excitation lights emitted from the solid-state light sources SS are s-polarized light. However, not only this, but the solid-state light sources SS that emit the excitation lights of the s-polarized light and the solid-state light sources SS that emit excitation lights of p-polarized light may be mixed. In this case, the first phase difference element 53 explained below can be omitted.

The light combining member 513 transmits excitation light emitted from the first light source 511 along the first illumination optical axis Ax1, reflects, along the first illumination optical axis Ax1, excitation light emitted from the second light source 512 along a direction crossing the first illumination optical axis Ax1, and combines the excitation lights. In this embodiment, the light combining member 513 is configured as a tabular member on which a plurality of passing parts through which the excitation light emitted from the first light source 511 passes and a plurality of reflecting parts that reflect the excitation light emitted from the second light source 512 are alternately arrayed. The excitation lights passing or reflected via the light combining member 513 are made incident on the afocal optical element 52.

In this embodiment, the light source 51 functioning as the light emitting device includes the first light source 511, the second light source 512, and the light combining member 513. However, not only this, but the light source 51 may include only the first light source 511 or may include a larger number of light sources.

1.1.7. Configuration of the Afocal Optical Element

The afocal optical element 52 adjusts a light beam diameter of excitation light made incident thereon from the light source 51. In other words, the afocal optical element 52 reduces the light beam diameter of the excitation light. Specifically, the afocal optical element 52 includes a lens 521 that condenses excitation light made incident thereon as parallel light from the light source 51 and reduces a light beam diameter and a lens 522 that collimates and emits excitation light made incident thereon from the lens 521.

1.1.8. Configuration of the First Phase Difference Element

The first phase difference element 53 is a half wavelength plate. By passing through the first phase difference element 53, a part of excitation light of the s-polarized light made incident on the first phase difference element 53 from the afocal optical element 52 is converted into excitation light of the p-polarized light to be excitation light in which the s-polarized light and the p-polarized light are mixed. Such excitation light is made incident on the homogenizer optical device 54.

1.1.9. Configuration of the Homogenizer Optical Device

The homogenizer optical device 54 homogenizes an illuminance distribution of excitation light made incident on regions to be illuminated in the light diffusing device 58 and the wavelength conversion device 6. The excitation light passed through the homogenizer optical device 54 is made incident on the light combination device 55. Such a homogenizer optical device 54 includes a first multi-lens 541 and a second multi-lens 542.

The first multi-lens 541 has a configuration in which a plurality of first lenses 5411 are arrayed in a matrix shape in an orthogonal surface orthogonal to the first illumination optical axis Ax1. The first multi-lens 541 divides excitation light made incident thereon into a plurality of partial light beams.

The second multi-lens 542 has a configuration in which a plurality of second lenses 5421 corresponding to the plurality of first lenses 5411 are arrayed in a matrix shape in an orthogonal surface orthogonal to the first illumination optical axis Ax1. The second multi-lens 542 superimposes the divided plurality of partial light beams on the regions to be illuminated in cooperation with the second lenses 5421 and the condensing elements 57 and 59. Consequently, illuminance in a surface orthogonal to the center axis of the excitation light made incident on the regions to be illuminated is homogenized. Such a homogenizer optical device 54 may be disposed between the afocal optical element 52 and the first phase difference element 53.

1.1.10. Configuration of the Light Combination Device

The light combination device 55 is a PBS (Polarizing Beam Splitter) including a prism 551 formed in a substantially right angled isosceles triangular prism shape. A surface 552 corresponding to an oblique side is inclined approximately 45° with respect to each of the first illumination optical axis Ax1 and the second illumination optical axis Ax2. Of surfaces 553 and 554 corresponding to adjacent sides, the surface 553 crosses the second illumination optical axis Ax2 and the surface 554 crosses the first illumination optical axis Ax1. A polarization separation layer 555 having wavelength selectivity is formed on the surface 552 among the surfaces 552 to 554.

Besides having a characteristic of separating s-polarized light and p-polarized light included in excitation light made incident on the polarization separation layer 555, the polarization separation layer 555 has a characteristic of causing fluorescence generated in the wavelength conversion device 6 to pass irrespective of a polarization state of the fluorescence. In other words, the polarization separation layer 555 has a polarization separation characteristic of wavelength selectivity for, for light having a wavelength in a blue light region, separating s-polarized light and p-polarized light but, for lights having wavelengths in a green light region and a red light region, causing each of s-polarized light and p-polarized light to pass.

With the light combination device 55 functioning as the light separating device as well in this way, in excitation light made incident on the light combination device 55 from the homogenizer optical device 54, p-polarized light passes to the second phase difference element 56 side along the first illumination optical axis Ax1 and s-polarized light is reflected to the second condensing element 59 side along the second illumination optical axis Ax2. As explained in detail below, the light combination device 55 combines blue light, which is excitation light, made incident thereon via the second phase difference element 56 and fluorescence made incident thereon via the second condensing element 59.

1.1.11. Configuration of the Second Phase Difference Element

The second phase difference element 56 is a quarter wavelength plate. The second phase difference element 56 converts excitation light of p-polarized light made incident thereon from the light combination device 55 into excitation light of circularly polarized light and converts circularly polarized light, which rotates reversely to the circularly polarized light and is excitation light made incident thereon from the first condensing element 57, into s-polarized light.

1.1.12. Configuration of the First Condensing Element

The first condensing element 57 is an optical element that condenses, in the light diffusing device 58, excitation light passed through the second phase difference element 56. In other words, the first condensing element 57 focuses, on the light diffusing device 58, excitation light made incident thereon. In this embodiment, the first condensing element 57 is configured by three pickup lenses 571 to 573. However, the number of lenses configuring the first condensing element 57 is not limited to three.

1.1.13. Configuration of the Light Diffusing Device

The light diffusing device 58 diffuses, at the same diffusion angle as a diffusion angle of fluorescence generated and emitted by the wavelength conversion device 6, excitation light made incident thereon. The light diffusing device 58 includes a disk-shaped light diffusing element 581, on which an annular reflection layer centering on a rotation center is formed, and a rotating section 582 that rotates the light diffusing element 581. The reflection layer causes incident light to reflect in a Lambertian manner.

The excitation light, that is, diffused light diffused and reflected by such a light diffusing element 581 is made incident on the second phase difference element 56 again via the first condensing element 57. When being reflected by the light diffusing element 581, circularly polarized light made incident on the light diffusing element 581 changes to reversely rotating circularly polarized light. In a process of passing through the second phase difference element 56, the circularly polarized light is converted into excitation light of s-polarized light, a polarization direction of which is rotated 90° with respect to excitation light of p-polarized light that passes through the light combination device 55. The excitation light of the s-polarized light is reflected by the polarization separation layer 555 and is made incident on the homogenizing device 7 as blue light along the second illumination optical axis Ax2.

1.1.14. Configuration of the Second Condensing Element

The excitation light of the s-polarized light passed through the homogenizer optical device 54 and reflected by the polarization separation layer 555 is made incident on the second condensing element 59. Besides condensing and focusing the incident excitation light on a wavelength conversion layer 612 of a wavelength conversion element 61, which is the region to be illuminated of the wavelength conversion device 6, as explained above, the second condensing element 59 collimates fluorescence emitted from the wavelength conversion device 6 and emits the fluorescence toward the polarization separation layer 555. In this embodiment, the second condensing element 59 is configured by three pickup lenses 591 to 593. However, like the first condensing element 57, the number of lenses included in the second condensing element 59 is not limited to three.

1.1.15. Configuration of the Wavelength Conversion Device

The wavelength conversion device 6 includes a rotating device 63, a supporting body 611 functioning as a substrate, a wavelength conversion element 61, and a first cooling device 64. The rotating device 63 rotates the supporting body 611. The supporting body 611 includes a first surface 611A, which is an incident side of the excitation light, and a second surface 611B disposed at the opposite side of the first surface 611A. The wavelength conversion element 61 is provided on the first surface 611A and converts a wavelength of light made incident thereon. The wavelength conversion element 61 includes the wavelength conversion layer 612 and a reflection layer 613. In the wavelength conversion element 61, the reflection layer 613 is provided in contact with the first surface 611A, the wavelength conversion layer 612 is provided in contact with the reflection layer 613, and the reflection layer 613 and the wavelength conversion layer 612 are stacked. In other words, a part of the excitation light reaches the reflection layer 613 after being made incident on the wavelength conversion layer 612. The first cooling device 64 is provided on the second surface 611B and cools the wavelength conversion element 61. The first cooling device 64 includes, in the inside, a space in which working fluid is encapsulated explained below. A detailed configuration of the wavelength conversion device 6 is explained below.

The wavelength conversion layer 612 is a region to be illuminated by the homogenizer optical device 54 and the second condensing element 59. The wavelength conversion layer 612 is a phosphor layer including a phosphor that emits fluorescence, which is non-polarized light, excited by excitation light made incident thereon, for example, fluorescence having a peak wavelength in a wavelength region of 500 nm to 700 nm. In other words, the wavelength conversion layer 612 converts excitation light having a first wavelength band into fluorescence having a second wavelength band different from the first wavelength band. A part of the fluorescence generated in such a wavelength conversion layer 612 is emitted to the second condensing element 59 side. Another part of the fluorescence is emitted to the reflection layer 613 side.

The reflection layer 613 is disposed between the wavelength conversion layer 612 and the supporting body 611 and reflects fluorescence made incident thereon from the wavelength conversion layer 612 to the second condensing element 59 side.

When excitation light is irradiated on the wavelength conversion layer 612, the fluorescence is diffused and emitted to the second condensing element 59 side by the wavelength conversion layer 612 and the reflection layer 613. The fluorescence is made incident on the polarization separation layer 555 via the second condensing element 59, passes through the polarization separation layer 555 along the second illumination optical axis Ax2, and is made incident on the homogenizing device 7. In other words, the fluorescence passes through the polarization separation layer 555 to thereby be made incident on the homogenizing device 7 as the illumination light WL together with excitation light, which is blue light, reflected by the polarization separation layer 555.

The wavelength conversion layer 612 generates heat with incidence of excitation light. The generated heat is transferred to the supporting body 611 via the reflection layer 613. The heat transferred to the supporting body 611 is radiated by the first cooling device 64 coupled to the second surface 611B on the opposite side of the first surface 611A in the supporting body 611.

The projector 1 includes a cooling fan 9 that blows air to the first cooling device 64. Cooling efficiency of the first cooling device 64 can be improved by the air blowing by the cooling fan 9. An axial fan, a centrifugal fan, or the like can be adopted as the cooling fan 9.

The wavelength conversion device 6 converts a wavelength of light having a first wavelength band emitted from the light source 51 into a second wavelength band different from the first wavelength band. In this embodiment, the light in the first wavelength band emitted by the light source 51 is excitation light of s-polarized light, which is excitation light of blue light, and the light in the second wavelength band converted by the wavelength conversion device 6 is fluorescence including green light and red light.

1.1.16. Configuration of the Homogenizing Device

The homogenizing device 7 homogenizes an illuminance distribution of illumination light made incident on image forming regions (modulation regions), which are regions to be illuminated of the light modulators 44R, 44G, and 44B for the respective color lights. The homogenizing device 7 includes a first lens array 71, a second lens array 72, a polarization conversion element 73, and a superimposition lens 74 disposed such that optical axes thereof coincide with the second illumination optical axis Ax2.

The first lens array 71 includes a plurality of small lenses 711 arrayed in a matrix shape in an orthogonal surface orthogonal to the second illumination optical axis Ax2 and divides illumination light made incident thereon into a plurality of partial light beams. Like the first lens array 71, the second lens array 72 includes a plurality of small lenses 721 arrayed in a matrix shape in an orthogonal surface orthogonal to the second illumination optical axis Ax2. These small lenses 721 are in a one-to-one relation with the small lenses 711 corresponding thereto. The small lenses 721 superimpose, in conjunction with the superimposition lens 74, the plurality of partial light beams divided by the small lenses 711 on the image forming regions of the light modulators 44. Consequently, an illuminance distribution of illumination light made incident on the modulation regions, which are the image forming regions, is homogenized. The polarization conversion element 73 is disposed between the second lens array 72 and the superimposition lens 74 and has a function of aligning polarization directions of the plurality of partial light beams made incident thereon.

1.2. Detailed Configuration of the Wavelength Conversion Device

Figure 4:
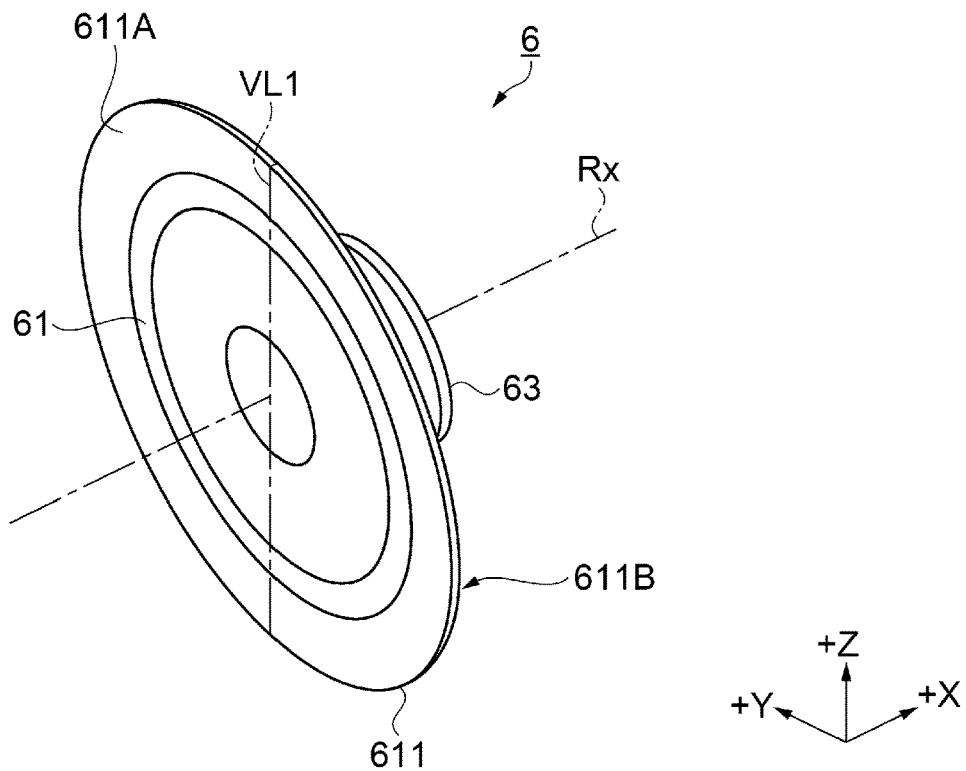
FIG. 4 is a perspective view showing the configuration of a wavelength conversion device.
Figure 5:
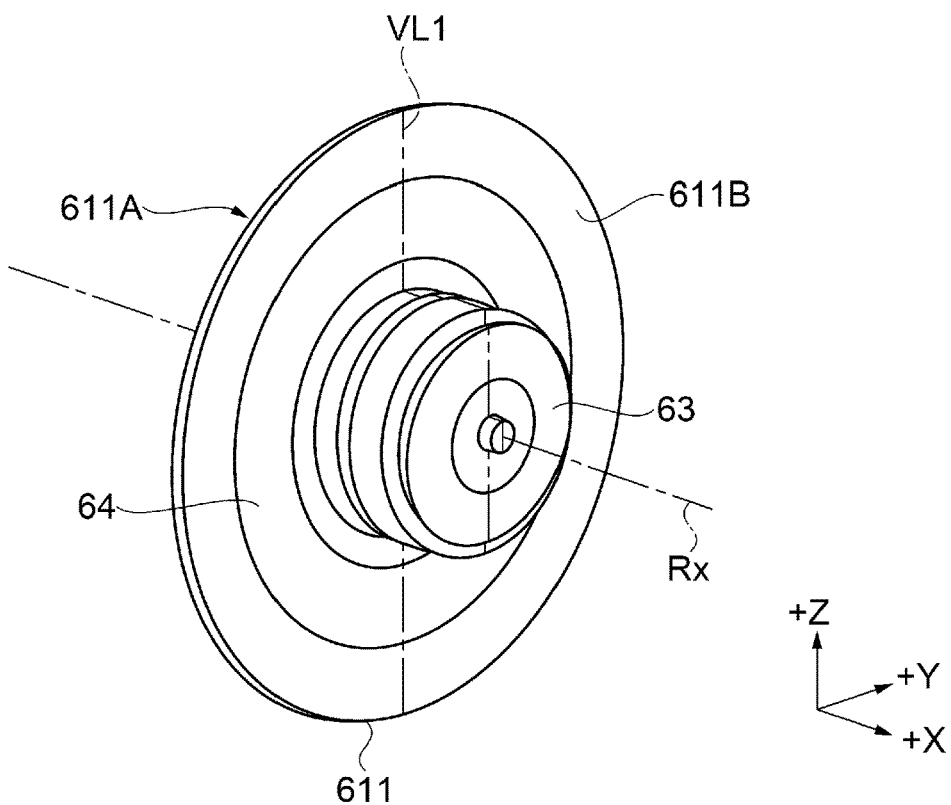
FIG. 5 is a perspective view showing the configuration of the wavelength conversion device.
Figure 6:
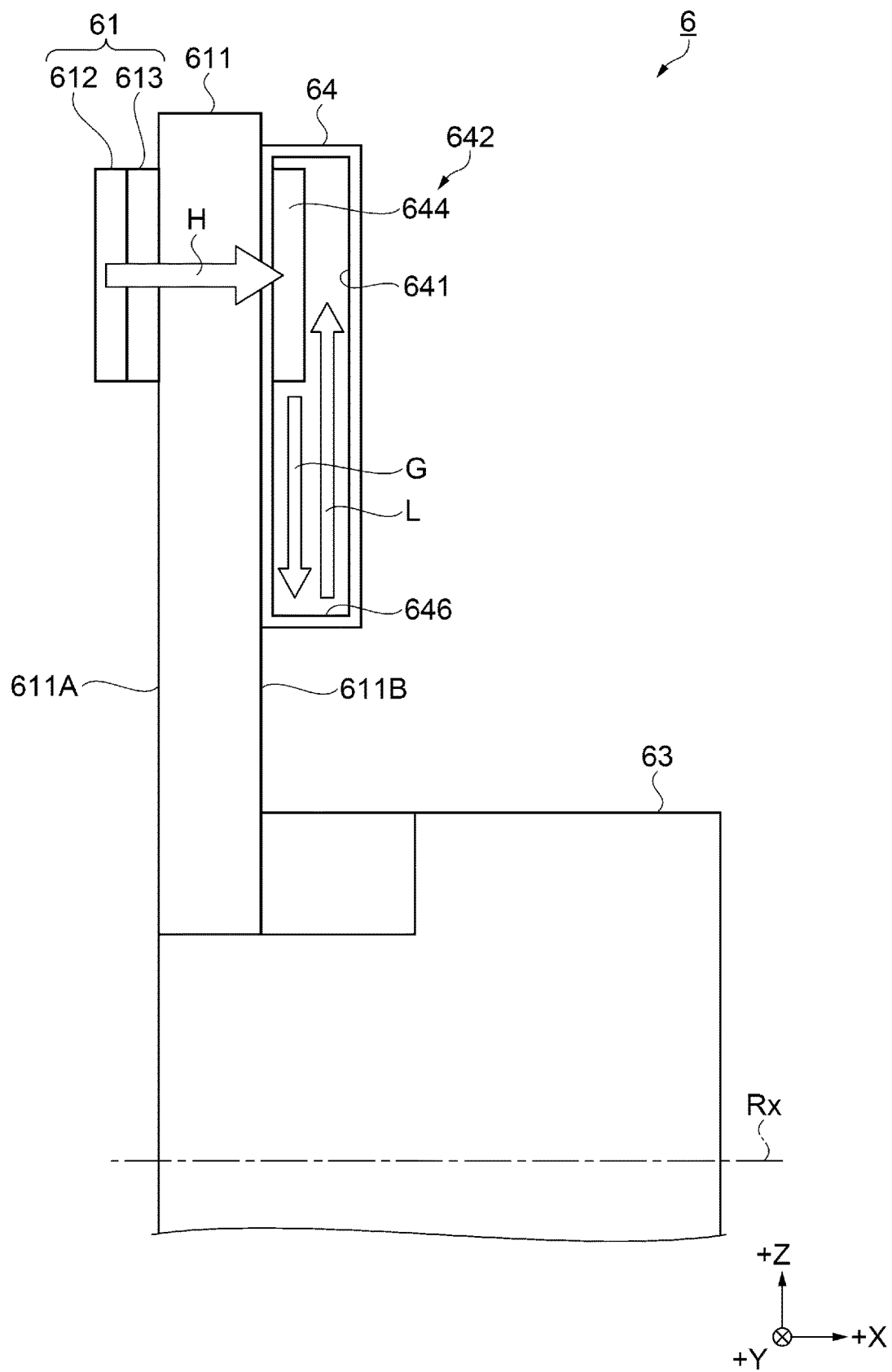
FIG. 6 is a sectional schematic view showing the configuration of a first cooling device.

A detailed configuration of the wavelength conversion device 6 according to this embodiment is explained with reference to FIGS. 4, 5, and 6. FIGS. 4 and 5 are perspective views showing the configuration of the wavelength conversion device 6. FIG. 6 is a sectional schematic view showing the configuration of the first cooling device 64. In the figures referred to below, X, Y, Z axes, which are coordinate axes, orthogonal to one another are added. A direction indicated by respective arrows in the X, Y, and Z axes is represented as a + direction. A direction opposite to the arrows is represented as a − direction. In FIG. 6, a cross section of a dividing surface VL1 shown in FIGS. 4 and 5 viewed from a −Y direction is shown.

In the wavelength conversion device 6, as shown in FIGS. 4 and 5, the rotating device 63 is disposed in the center of the supporting body 611 having a substantially disk shape. The rotating device 63 is, for example, a motor and rotates the supporting body 611 around a rotation axis Rx. The rotation of the supporting body 611 around the rotation axis Rx may be either clockwise or counterclockwise in a plan view from a +X direction. The supporting body 611 has a shape rotationally symmetrical with respect to the rotation axis Rx. As a material forming the supporting body 611, for example, metal such as aluminum or copper or ceramics can be adopted.

As shown in FIG. 4, the wavelength conversion element 61 is annularly disposed on the first surface 611A of the supporting body 611. The wavelength conversion element 61 is disposed on the supporting body 611 to be rotationally symmetrical with respect to the rotation axis Rx of the supporting body 611. The wavelength conversion element 61 is formed in a ring shape in a plan view from a −X direction. The width of the ring is formed larger than a region to be illuminated where the wavelength conversion element 61 is illuminated by the homogenizer optical device 54 and the second condensing element 59. Therefore, when the supporting body 611 is turned by the rotating device 63, the region to be illuminated relatively moves on a circular track on the ring-shaped wavelength conversion element 61.

As shown in FIG. 5, the first cooling device 64 is annularly disposed on the second surface 611B of the supporting body 611. The first cooling device 64 is disposed on the supporting body 611 to be rotationally symmetrical with respect to the rotation axis Rx. The first cooling device 64 is formed in a ring shape in the plan view from the +X direction. The width of the ring is formed larger than the width of the ring of the wavelength conversion element 61.

As shown in FIG. 6, the first cooling device 64 is disposed in a position corresponding to the wavelength conversion element 61 in the supporting body 611. Specifically, the first cooling device 64 is disposed to be opposed to the wavelength conversion element 61 across the supporting body 611 in the ±X direction. The first cooling device 64 is provided along the shape of the wavelength conversion element 61. In other words, when seen through from the +X direction, the first cooling device 64 is provided over the entire wavelength conversion element 61.

The wavelength conversion element 61 includes the wavelength conversion layer 612 and the reflection layer 613. The wavelength conversion layer 612 is disposed at an incident side of excitation light. The reflection layer 613 is disposed at the supporting body 611 side. The wavelength conversion layer 612 is formed by, for example, a layer containing $(Y, Gd)_3(Al,Ga)_5O_{12}$:Ce, which is a YAG (Yttrium Aluminum Garnet)-based phosphor. The reflection layer 613 is designed to reflect fluorescence, which is light in the second wavelength band, at high efficiency.

The wavelength conversion element 61 converts excitation light made incident thereon from the −X direction into fluorescence and emits the fluorescence to the −X direction.

At this time, heat H generated in the wavelength conversion element 61 is transferred to the first cooling device 64 via the supporting body 611.

The first cooling device 64 includes, on the inside of a housing thereof, a space 641 in which working fluid is encapsulated and cools the wavelength conversion element 61. The space 641 extends from the outer edge side of the substantially disk-shaped supporting body 611 to the rotation axis Rx side. The sectional shape along an XZ plane of the space 641 is a substantially rectangular shape, the dimension in a ±Z direction of which is relatively large, in the cross section shown in FIG. 6. Although not shown in FIG. 6, the space 641 is provided to communicate in a ring shape along the external shape of the ring-shaped first cooling device 64. As a material forming the housing of the first cooling device 64, metal such as copper having thermal conductivity is adopted.

The working fluid is encapsulated in the space 641 in a decompressed state. Accordingly, in the space 641, the working fluid evaporates at a low boiling point compared with the boiling point under the atmospheric pressure. Water can be adopted as the working fluid.

The first cooling device 64 includes, in the space 641, an evaporator 642 and a condenser 646. The evaporator 642 evaporates the working fluid in a liquid phase with heat transferred from the wavelength conversion element 61 and changes the working fluid in the liquid phase to the working fluid in a gas phase. The evaporator 642 includes a liquid retaining part 644 that retains the working fluid in the liquid phase. The evaporator 642 is a part including a region where the liquid retaining part 644 is disposed. The condenser 646 condenses the working fluid in the gas phase and changes the working fluid in the gas phase to the working fluid in the liquid phase. The condenser 646 is a part including a region at the rotation axis Rx side in the space 641.

The liquid retaining part 644 is provided at the outer edge side in the space 641 and disposed in a position corresponding to the wavelength conversion element 61. In other words, the liquid retaining part 644 is disposed to be opposed to the wavelength conversion element 61 in the ±X direction. The liquid retaining part 644 has a ring-like external shape in the plan view from the +X direction.

The working fluid in the liquid phase permeates and is retained in the liquid retaining part 644. Accordingly, as the liquid retaining part 644, a porous body including a plurality of holes or a molded body of fiber is adopted such that the working fluid in the liquid phase permeates. As a material forming the porous body, metal such as stainless steel or copper or an inorganic substance such as glass or ceramics can be adopted. As a material forming the fiber, metal such as stainless steel or copper or an inorganic substance such as glass can be adopted. Examples of the molded body include non-woven fabric obtained by compression-molding the fiber and the fiber woven into a mesh shape.

The positions of the part of the evaporator 642 and the part of the condenser 646 excluding the liquid retaining part 644 change depending on an operation state or the like of the first cooling device 64. In this embodiment, the liquid retaining part 644 is disposed only on a wall surface on the −X direction side in the space 641. However, the disposition of the liquid retaining part 644 is not limited to this.

The heat H transferred to the first cooling device 64 is transferred into the space 641 via the supporting body 611 by these components. The evaporator 642 evaporates, with the heat H, the working fluid in the liquid phase retained in the liquid retaining part 644 and changes the working fluid in the liquid phase to the working fluid in the gas phase. At this time, the heat of the wavelength conversion element 61 is absorbed and the wavelength conversion element 61 is cooled by the heat of vaporization of the working fluid in the liquid phase via the supporting body 611. Evaporation of the working fluid in the liquid phase sometimes occurs in the evaporator 642 other than the liquid retaining part 644.

The working fluid changed from the liquid phase to the gas phase retains the heat transferred from the wavelength conversion element 61, moves in the −Z direction mainly as a flow G, and reaches the condenser 646. The condenser 646 condenses the working fluid in the gas phase and changes the working fluid in the gas phase to the working fluid in the liquid phase. At this time, the working fluid in the gas phase radiates heat and condenses. The heat radiated from the working fluid in the gas phase is radiated to the outside of the first cooling device 64 from the condenser 646.

The working fluid changed from the gas phase to the liquid phase moves to the evaporator 642 in the +Z direction mainly as a flow L. During the operation of the first cooling device 64, since the rotating device 63 is turning the supporting body 611, a centrifugal force is generated to the outer edge side of the supporting body 611, that is, in FIG. 6, in the +Z direction. Consequently, the centrifugal force acts on the working fluid changed from the gas phase to the liquid phase. The movement of the working fluid in the +Z direction is facilitated. The working fluid in the liquid phase moved to the evaporator 642 is retained by the liquid retaining part 644. In this way, the first cooling device 64 is a so-called vapor chamber and enables cooling by transfer of heat by continuously and repeatedly expressing the evaporation and the condensation of the working fluid.

The flows G and L indicate main lines of flow of the working fluid. The flow of the working fluid is not limited to the flows G and L. For example, the working fluid in the gas phase generated in the liquid retaining part 644 may be condensed on the inner wall opposed to the liquid retaining part 644 in the ±X direction in the space 641.

In this embodiment, the liquid retaining part 644 is not provided at the end portion on the rotation axis Rx direction in the space 641. The liquid retaining part 644 is not provided on the inner wall on the +X direction side in the space 641. Further, the liquid retaining part 644 is not provided between the end portion at the rotation axis Rx side and a portion substantially in the middle in the ±Z direction of the first cooling device 64 on the inner wall at the −X direction side in the space 641. As explained above, since the wavelength conversion device 6 is rotated by the rotating device 63 during operation, a centrifugal force is generated at the outer edge side in the supporting body 611. With the centrifugal force, the working fluid changed from the gas phase to the liquid phase moves toward the evaporator 642 located at the outer edge side, that is, toward the liquid retaining part 644. At this time, since a liquid retaining part is absent in a path on which the working fluid in the liquid phase receives the centrifugal force and moves, compared with when the liquid retaining part is present in the path, it is possible to more quickly move the working fluid in the liquid phase to the liquid retaining part 644 of the evaporator 642 present in the position corresponding to the wavelength conversion element 61. On the other hand, when the liquid retaining part is provided in the path, the working fluid in the liquid phase reached the liquid retaining part gradually moves in the liquid retaining part toward the liquid retaining part 644 with a capillary force. Therefore, a cycle of the change from the gas phase to the liquid phase and to the gas phase of the working fluid efficiently progresses. Consequently, it is possible to improve cooling efficiency for the wavelength conversion element 61 by the first cooling device 64.

As explained above, the following effects can be obtained by the wavelength conversion device 6, the illumination device 41, and the projector 1 according to the first embodiment.

The cooling efficiency for the wavelength conversion element 61 can be improved from that in the past. Specifically, the first cooling device 64 is provided in the position corresponding to the wavelength conversion element 61 across the supporting body 611 functioning as the substrate. In the first cooling device 64, the liquid retaining part 644 is disposed in the position corresponding to the wavelength conversion element 61. Therefore, the heat of the wavelength conversion element 61 is transferred mainly to the liquid retaining part 644. Since the working fluid in the liquid phase is retained by the liquid retaining part 644, the working fluid in the liquid phase evaporates with the transferred heat H and changes to the working fluid in the gas phase. The heat of the wavelength conversion element 61 absorbed and the wavelength conversion element 61 is cooled by the heat of vaporization of the working fluid at this time.

In the first cooling device 64, the working fluid changed from the liquid phase to the gas phase in the liquid retaining part 644 moves to the condenser 646. At this time, the heat H transferred from the wavelength conversion element 61 is also transferred from the evaporator 642 to the condenser 646 by the working fluid in the gas phase. In the condenser 646, the working fluid in the gas phase radiates heat and condenses. The working fluid in the gas phase changes to the working fluid in the liquid phase. The heat radiated by the condensation of the working fluid is radiated from the first cooling device 64.

The space 641 of the first cooling device 64 extends from the outer edge side to the rotation axis Rx side. The liquid retaining part 644 is provided at the outer edge side in the space 641. Accordingly, the working fluid in the liquid phase condensed at the rotation axis Rx side of the space 641 easily moves from the rotation axis Rx side to the outer edge side with the centrifugal force generated by the rotation of the supporting body 611. In other words, after the working fluid in the liquid phase changes to the working fluid in the gas phase, the working fluid in the gas phase is quickly returned to the liquid retaining part 644 compared with when the centrifugal force does not act. Therefore, the cycle of the change from the gas phase to the liquid phase and to the gas phase of the working fluid efficiently progresses. Consequently, the cooling efficiency of the first cooling device 64 is improved. The cooling efficiency for the wavelength conversion element 61 can be improved. Therefore, it is possible to provide the wavelength conversion device 6 with improved cooling efficiency for the wavelength conversion element 61 from that in the past.

Since the shape of the first cooling device 64 conforms to the shape of the wavelength conversion element 61, the heat H of the wavelength conversion element 61 is easily transferred to the first cooling device 64. Accordingly, the cooling efficiency for the wavelength conversion element 61 can be further improved.

The working fluid changed from the gas phase to the liquid phase at the end portion of the space 641 of the first cooling device 64 easily moves to the liquid retaining part 644 with the centrifugal force generated by the rotation of the supporting body 611. Accordingly, it is possible to cause the cycle of the change from the gas phase to the liquid phase and to the gas phase of the working fluid in the first cooling device 64 to more efficiently progress.

Since the cooling efficiency for the wavelength conversion element 61 is improved, the supporting body 611 can be reduced in size. Since the wavelength conversion device 6 does not include a cooling fin or the like, wind noise and the like less easily occur. Noise during operation can be reduced compared with when the wavelength conversion device 6 includes the cooling fin or the like. Further, since the cooling efficiency of the first cooling device 64 is improved, it is possible to suppress occurrence of a deficiency in the wavelength conversion device 6 due to overheat.

The first cooling device 64 of the wavelength conversion device 6 may include a not-shown cooling fin. In this case, heat radiation from the condenser 646 of the first cooling device 64 is facilitated by the cooling fin. The cooling efficiency of the first cooling device 64 can be further improved. The cooling fin may be separated from the first cooling device 64 and attached to the first cooling device 64 or may be integrated with the first cooling device 64.

In the illumination device 41, the cooling efficiency is improved for heat generation involved in conversion of the wavelength of light emitted from the light source 51 functioning as the light source. Deterioration in the wavelength conversion efficiency can be suppressed. Since the cooling efficiency of the first cooling device 64 is improved, it is possible to suppress occurrence of a deficiency in the illumination device 41 due to overheat.

In the projector 1, deterioration in the wavelength conversion efficiency is suppressed and the illumination efficiency can be stabilized. Since the projector 1 further includes the cooling fan 9 that blows air to the first cooling device 64, the cooling efficiency for the wavelength conversion element 61 is further improved. The illumination efficiency of the projector 1 can be more stabilized. Further, since the cooling efficiency of the first cooling device 64 is improved, it is possible to suppress occurrence of a deficiency in the projector 1 due to overheat.

2. Second Embodiment

In a second embodiment, a wavelength conversion device 602 included in the illumination device 41 of the projector 1 is explained with reference to the drawings. In the wavelength conversion device 602 according to this embodiment, a form of a first cooling device is differentiated from that in the wavelength conversion device 6 in the first embodiment. Accordingly, the same components as the components in the first embodiment are denoted by the same reference numerals and signs and redundant explanation of the components is omitted.

2.1. Configuration of the First Cooling Device

Figure 7:
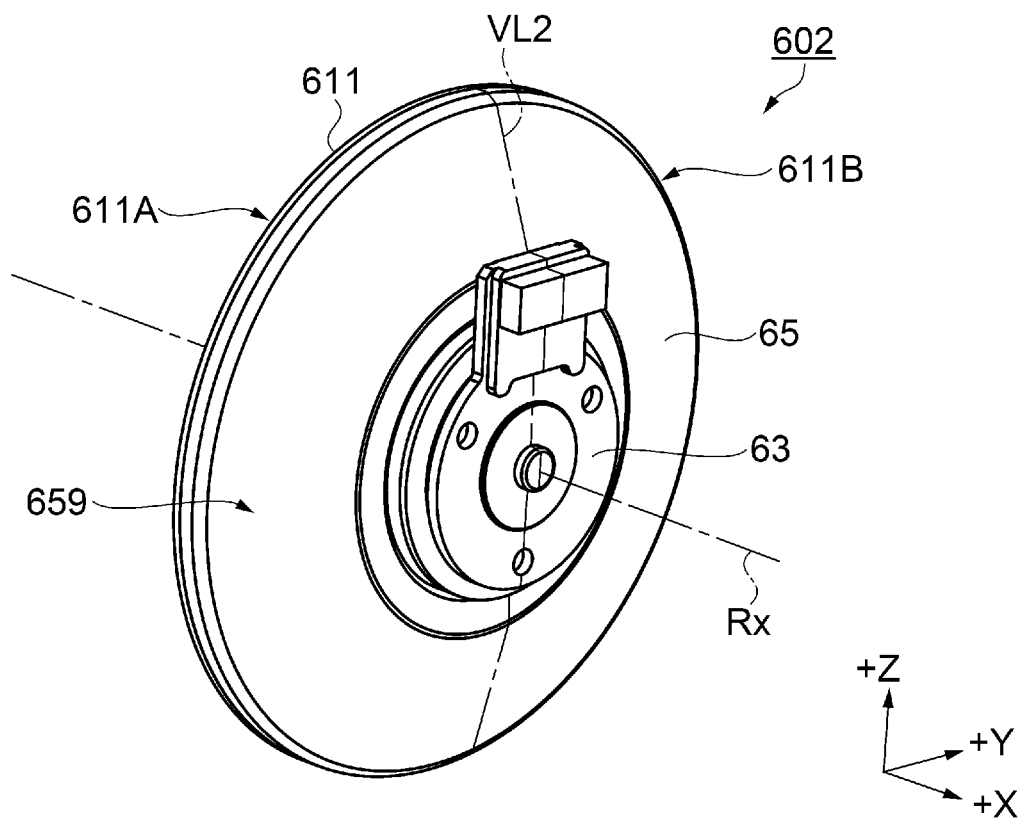
FIG. 7 is a perspective view showing the configuration of a first cooling device according to a second embodiment.
Figure 8:
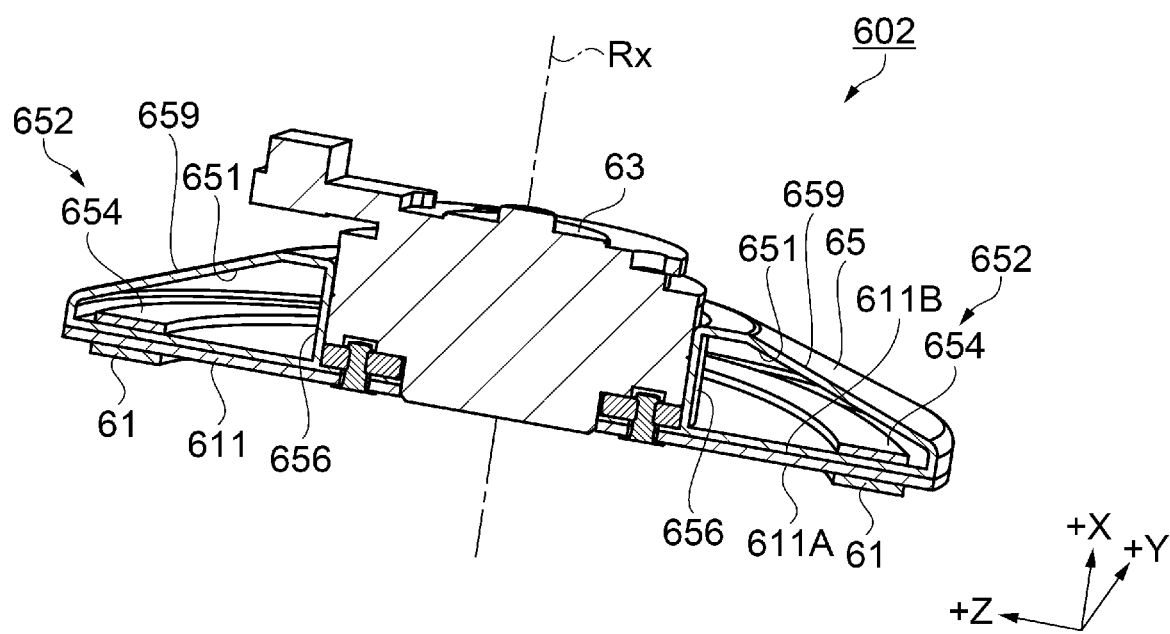
FIG. 8 is a sectional schematic view showing the configuration of the first cooling device.

The configuration of a first cooling device 65 in the wavelength conversion device 602 according to this embodiment is explained with reference to FIGS. 7 and 8. FIG. 7 is a perspective view showing the configuration of the first cooling device 65 according to the second embodiment. FIG. 8 is a sectional schematic view showing the configuration of the first cooling device 65. In FIG. 8, a cross section of a dividing surface VL2 shown in FIG. 7 viewed from the −Y direction is shown.

As shown in FIG. 7, the first cooling device 65 includes an inclined surface 659. The first cooling device 65 in this embodiment is different from the first cooling device 64 in the first embodiment in that a housing of the first cooling device 65 includes the inclined surface 659.

As shown in FIG. 8, the first cooling device 65 includes the inclined surface 659 and includes, on the inside, a space 651 having a shape conforming to the shape of the inclined surface 659. Working fluid is encapsulated in the space 651. The first cooling device 65 includes, in the space 651, an evaporator 652 and a condenser 656. A liquid retaining part 654 is provided in the evaporator 652 disposed at the outer edge side of the space 651. The condenser 656 includes a region at the rotation axis Rx side of the space 651. As the working fluid, the same substance as the substance in the first embodiment can be adopted. As the liquid retaining part 654, the same configuration as the configuration in the first embodiment can be adopted.

When a direction from the first surface 611A to the second surface 611B along the rotation axis Rx is represented as a first direction, the first direction is the +X direction. The inclined surface 659 is inclined in a portion located in the +X direction such that the length of the space 651 along the +X direction increases from the outer edge side toward the rotation axis Rx side.

Specifically, the sectional shape along an XY plane of the space 651 is formed in a substantially trapezoidal shape by the inclined surface 659. Of a pair of bottom sides of the substantially trapezoidal shape, the length of the lower base in contact with the supporting body 611 is larger than the length of the upper base. Accordingly, in the space 651, a region at the outer edge side where the liquid retaining part 654 is provided is narrow and a region at the rotation axis Rx side including the condenser 656 is wide.

The first cooling device 65 of the wavelength conversion device 602 may include a not-shown cooling fin. In this case, heat radiation from the condenser 656 of the first cooling device 65 is facilitated by the cooling fin. Cooling efficiency of the first cooling device 65 can be improved. The cooling fin may be separated from the first cooling device 65 and attached to the first cooling device 65 or may be integrated with the first cooling device 65.

As explained above, with the wavelength conversion device 602 according to the second embodiment, the following effects can be obtained in addition to the effects in the first embodiment.

In the space 651, the region at the outer edge side is formed narrow with respect to the region at the rotation axis Rx side. Accordingly, the condenser 656 is wide with respect to the evaporator 652 including the liquid retaining part 654. The working fluid in the gas phase easily condensates. In other words, the working fluid in the gas phase easily radiates heat. The working fluid in the liquid phase changed from the working fluid in the gas phase easily moves to the liquid retaining part 654 along the inclined surface 659 with a centrifugal force. Consequently, the cooling efficiency of the first cooling device 65 can be further improved.

3. Third Embodiment

In a third embodiment, a wavelength conversion device 603 included in the illumination device 41 of the projector 1 is explained with reference to the drawings. In the wavelength conversion device 603 according to this embodiment, a form of a first cooling device is differentiated from that in the wavelength conversion device 6 in the first embodiment. Accordingly, the same components as the components in the first embodiment are denoted by the same reference numerals and signs and redundant explanation of the components is omitted.

3.1. Configuration of the First Cooling Device

Figure 9:
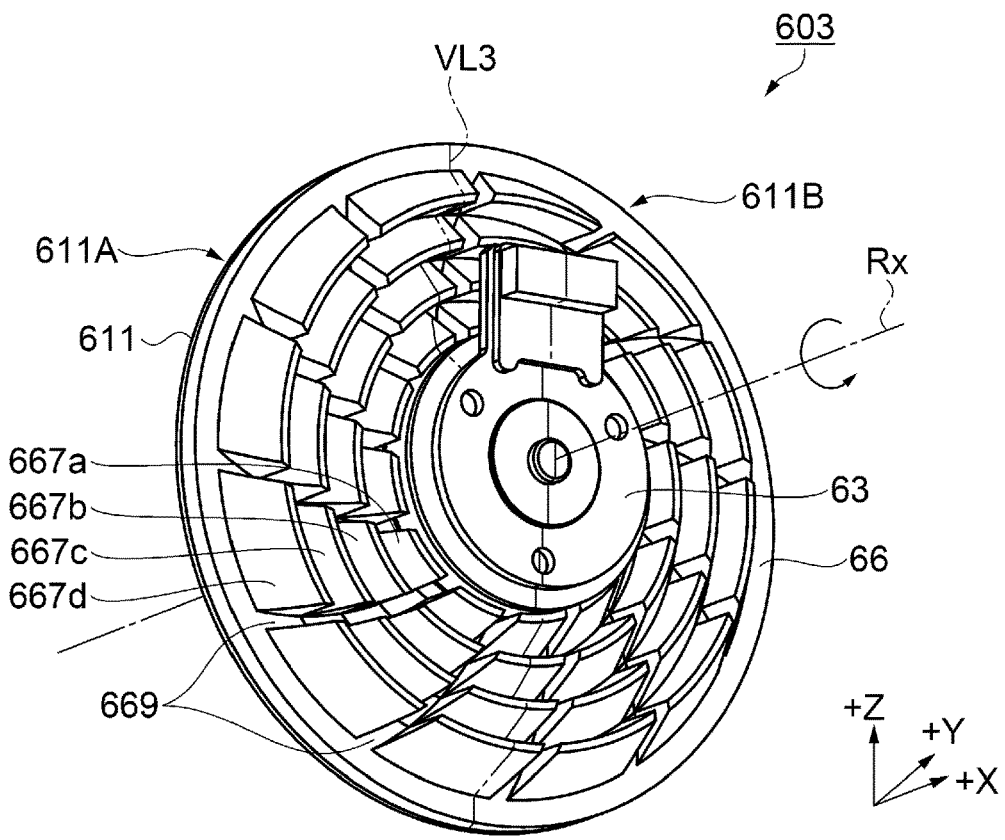
FIG. 9 is a perspective view showing the configuration of a first cooling device according to a third embodiment.
Figure 10:
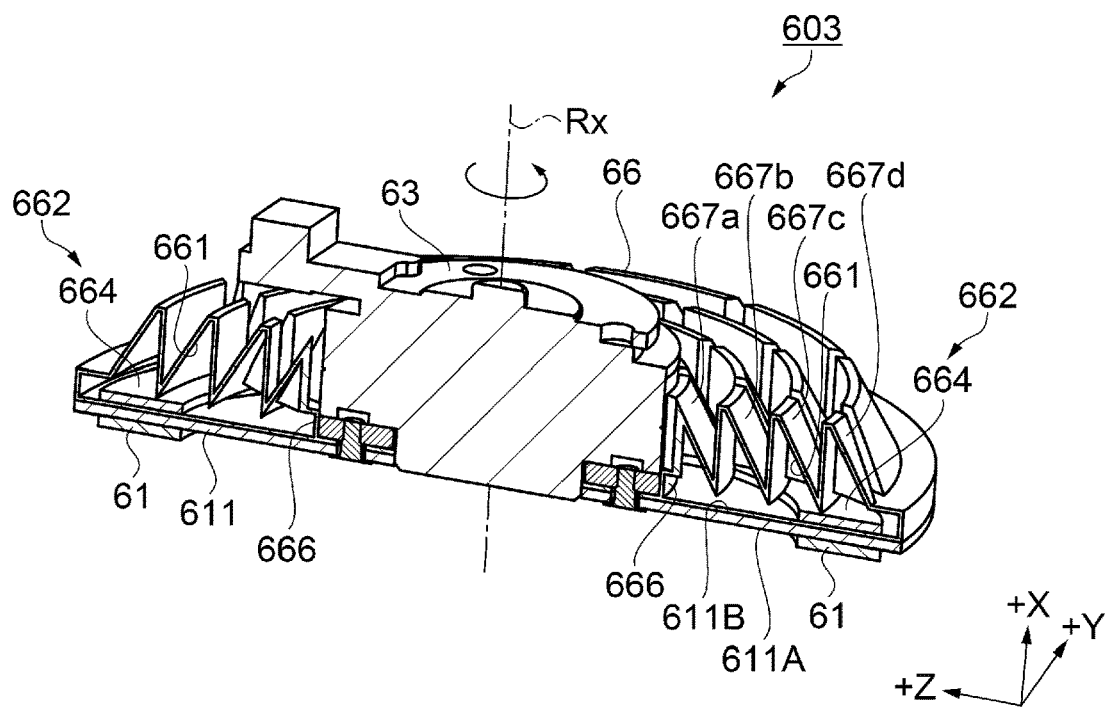
FIG. 10 is a sectional schematic view showing the configuration of the first cooling device.

The configuration of a first cooling device 66 in the wavelength conversion device 603 according to this embodiment is explained with reference to FIGS. 9 and 10. FIG. 9 is a perspective view showing the configuration of the first cooling device 66 according to the third embodiment. FIG. 10 is a sectional schematic view showing the configuration of the first cooling device 66. In FIG. 10, a cross section of a dividing surface VL3 shown in FIG. 9 viewed from the −Y direction is shown.

As shown in FIG. 9, the first cooling device 66 includes a plurality of fins 667a, 667b, 667c, and 667d. In the following explanation, the plurality of fins 667a, 667b, 667c, and 667d are simply referred to as plurality of fins 667 as well. A plurality of grooves 669 are provided in the plurality of fins 667. The first cooling device 66 in this embodiment is different from the first cooling device 64 in the first embodiment in that the first cooling device 66 includes the plurality of fins 667 and the plurality of grooves 669 are provided in the plurality of fins 667.

When a direction from the first surface 611A to the second surface 611B along the rotation axis Rx is represented as a first direction, the first direction is the +X direction. The plurality of fins 667 are disposed in parts located in the +X direction in the first cooling device 66. In other words, the plurality of fins 667 are provided at the +X direction side and disposed along a rotating direction of the supporting body 611. Specifically, the fin 667d is disposed substantially circularly along the outer edge of the supporting body 611 in a plan view from the +X direction. The fin 667c is disposed substantially circularly at the inner side, which is the rotation axis Rx side of the fin 667d. The fin 667b is disposed substantially circularly at the inner side of the fin 667c. The fin 667a is disposed substantially circularly at the inner side of the fin 667b. In other words, the fin 667d to the fin 667a are disposed in order from the outer edge of the supporting body 611 toward the rotation axis Rx.

The plurality of grooves 669 are provided in the plurality of fins 667 to divide each of the plurality of fins 667. As the plurality of grooves 669, twelve grooves are radially formed from the rotation axis Rx side of the supporting body 611 toward the outer edge side of the supporting body 611 in the first cooling device 66. The plurality of grooves 669 are curved with respect to a straight line connecting the rotation axis Rx and the outer edge of the supporting body 611, in other words, the normal of the outer edge of the supporting body 611 in the plan view from the +X direction.

The curve of the plurality of grooves 669 is designed such that, when the supporting body 611 turns counterclockwise in the plan view from the +X direction, air flows to be discharged from the rotating device 63 side to the outer edge side of the supporting body 611 through the plurality of grooves 669. Consequently, heated air less easily flows toward the rotating device 63. Overheat of the rotating device 63 can be suppressed. The curve of the plurality of grooves 669 only has to be designed according to a direction in which the supporting body 611 turns and is not limited to the above. The numbers of the plurality of fins 667 and the plurality of grooves 669 are not limited to the above.

As shown in FIG. 10, the first cooling device 66 includes a space 661 having a shape conforming to the shape of the plurality of fins 667. Working fluid is encapsulated in the space 661. The first cooling device 66 includes an evaporator 662 and a condenser 666 in the space 661. A liquid retaining part 664 is provided in the evaporator 662 disposed at the outer edge side of the space 661. The condenser 666 includes a region at the rotation axis Rx side of the space 661. As the working fluid, the same substance as the substance in the first embodiment can be adopted. As the liquid retaining part 664, the same configuration as the configuration in the first embodiment can be adopted.

Each of the plurality of fins 667 is formed in a shape sharpened at the +X direction side. As opposed to the plurality of fins 667 being divided by the plurality of grooves 669, the space 661 communicates without being divided by the plurality of grooves 669.

The first cooling device 66 of the wavelength conversion device 603 may include a not-shown cooling fin. In this case, heat radiation from the condenser 666 of the first cooling device 66 is facilitated by the cooling fin. Cooling efficiency of the first cooling device 66 can be improved. The cooling fin may be separated from the first cooling device 66 and attached to the first cooling device 66 or may be integrated with the first cooling device 66.

As explained above, with the wavelength conversion device 603 according to the third embodiment, the following effects can be obtained in addition to the effects in the first embodiment.

The working fluid in the liquid phase easily moves to the liquid retaining part 664 along the inner surface of the space 661 at the plurality of fins 667 side with a centrifugal force generated by rotation of the supporting body 611. The plurality of fins 667 are divided and the surface areas of the plurality of fins 667 are expanded by the plurality of grooves 669. Air easily flows to the plurality of grooves 669 according to the rotation of the supporting body 611. Accordingly, heat radiation from the first cooling device 66 is facilitated. Consequently, the cooling efficiency of the first cooling device 66 can be further improved.

4. Fourth Embodiment

In a fourth embodiment, a wavelength conversion device 604 included in the illumination device 41 of the projector 1 is explained with reference to the drawings. In the wavelength conversion device 604 according to this embodiment, a form of first cooling devices is differentiated from that in the wavelength conversion device 6 in the first embodiment. Accordingly, the same components as the components in the first embodiment are denoted by the same reference numerals and signs and redundant explanation of the components is omitted.

4.1. Configuration of the First Cooling Devices

Figure 11:
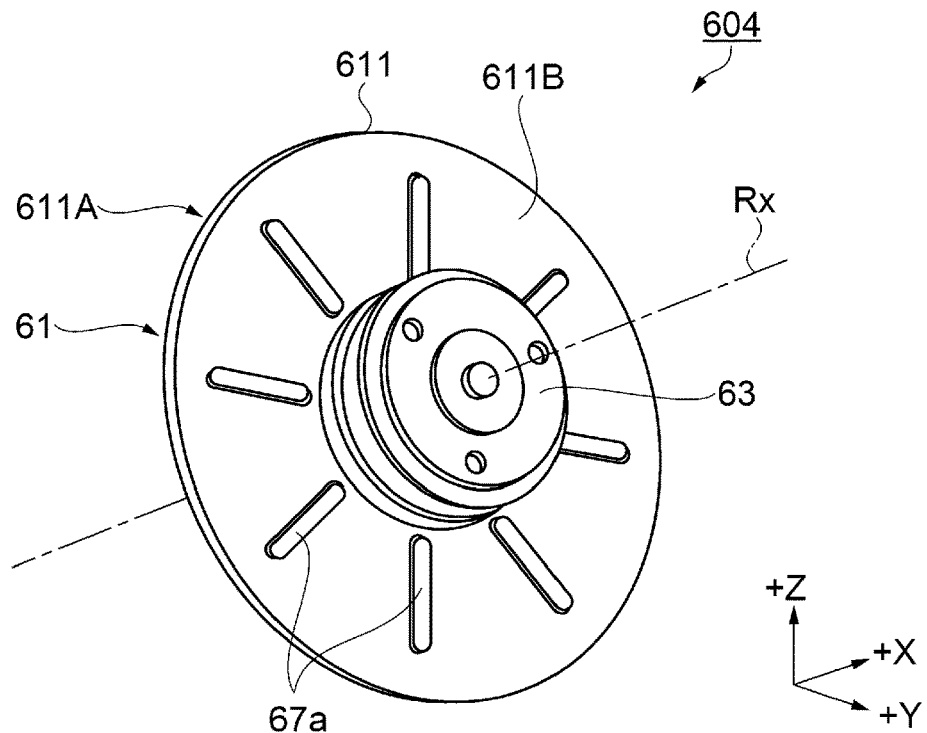
FIG. 11 is a perspective view showing the configuration of first cooling devices according to a fourth embodiment.

The configuration of a plurality of first cooling devices 67a in the wavelength conversion device 604 according to this embodiment is explained with reference to FIG. 11. FIG. 11 is a perspective view showing the configuration of the first cooling devices 67a according to the fourth embodiment.

As shown in FIG. 11, the plurality of first cooling devices 67a are provided side by side in a rotating direction. The plurality of first cooling devices 67a respectively extend from the rotation axis Rx side of the supporting body 611 to the outer edge side of the supporting body 611. Specifically, in the wavelength conversion device 604, on the second surface 611B of the supporting body 611, eight first cooling devices 67a are radially disposed from the rotation axis Rx side of the supporting body 611 toward the outer edge side of the supporting body 611. The first cooling devices 67a include, on the insides, not-shown spaces in which working fluid is encapsulated and cool the wavelength conversion device 604. In the first cooling devices 67a, substantially bar-shaped heat pipes are adopted instead of the first cooling device 64 in the first embodiment. The number of the first cooling devices 67a is not limited to eight.

The first cooling devices 67a are crushed in the ±X direction by pressing. Surfaces along a YZ plane of the first cooling devices 67a are formed flat. Accordingly, compare with when the pressing is not applied, a contact area of the first cooling devices 67a and the second surface 611B of the supporting body 611 increases. Consequently, exchange of heat can be facilitated between the supporting body 611 and the first cooling devices 67a. The pressing in the first cooling devices 67a is not essential. The pressing may be omitted when the exchange of heat is sufficiently performed between the supporting body 611 and the first cooling devices 67a.

As a material forming the first cooling devices 67a, metal such as coper having thermal conductivity is adopted. The working fluid is encapsulated in the spaces of the first cooling devices 67a in a decompressed state. Accordingly, the working fluid evaporates at a boiling point lower than the boiling point under the atmospheric pressure. Water can be adopted as the working fluid. A publicly-known heat pipe can be adopted as the first cooling devices 67a.

Although not shown in FIG. 11, the first cooling devices 67a include evaporators and condensers in the spaces on the insides. The evaporators are disposed at the outer edge side of the spaces. The condensers are disposed at the rotation axis Rx side of the spaces. The evaporators include liquid retaining parts. The liquid retaining parts are disposed in positions corresponding to the wavelength conversion element 61. In other words, the evaporators of the first cooling devices 67a are disposed in parts corresponding to the not-shown wavelength conversion element 61 on the first surface 611A. Accordingly, heat of the wavelength conversion element 61 is transferred to the evaporators via the supporting body 611. The working fluid in the liquid phase evaporates mainly in the liquid retaining parts of the evaporators with the heat. The working fluid in the liquid phase changes to the working fluid in the gas phase. At this time, the heat of the wavelength conversion element 61 is absorbed via the supporting body 611 and the wavelength conversion element 61 is cooled by the heat of vaporization of the working fluid in the liquid phase.

The working fluid changed from the liquid phase to the gas phase mainly moves to the rotation axis Rx side and reaches the condensers. The condensers condense the working fluid in the gas phase and change the working fluid in the gas phase to the working fluid in the liquid phase. At this time, the working fluid in the gas phase radiates heat and condenses. The heat radiated from the working fluid in the gas phase is discharged to the outside of the first cooling devices 67a from the condensers.

The working fluid changed from the gas phase to the liquid phase mainly moves to the evaporators. During the operation of the first cooling devices 67a, since the rotating device 63 is turning the supporting body 611, a centrifugal force is generated to the outer edge side of the supporting body 611. Consequently, the centrifugal force acts on the working fluid changed from the gas phase to the liquid phase. Movement to the outer edge side of the working fluid is facilitated. In this way, the first cooling devices 67a enable cooling by transfer of heat by continuously and repeatedly expressing evaporation and condensation of the working fluid.

In this embodiment, the length direction in the first cooling devices 67a having a substantially bar shape is arranged to coincide with the normal of the outer edge of the supporting body 611 in the plan view from the +X direction. However, not only this, but the length direction in the substantially bar-shaped first cooling devices 67a may be arranged to cross the normal.

The plurality of first cooling devices 67a of the wavelength conversion device 604 may respectively include not-shown cooling fins. In this case, heat radiation from the condensers of the respective plurality of first cooling devices 67a is facilitated by the cooling fins. Cooling efficiency of the plurality of first cooling devices 67a can be improved. The cooling fins may be separated from the respective plurality of first cooling devices 67a and attached to the first cooling devices 67a or may be integrated with the respective plurality of first cooling devices 67a.

As explained above, with the wavelength conversion device 604 according to the fourth embodiment, the following effects can be obtained in addition to the effects in the first embodiment.

The cooling efficiency for the wavelength conversion element 61 can be improved and the first cooling devices 67a can be reduced in size.

5. Fifth Embodiment

In a fifth embodiment, a wavelength conversion device 605 included in the illumination device 41 of the projector 1 is explained with reference to the drawings. In the wavelength conversion device 605 according to this embodiment, a form of first cooling devices is differentiated from that in the wavelength conversion device 604 in the fourth embodiment. Accordingly, the same components as the components in the fourth embodiment are denoted by the same reference numerals and signs and redundant explanation of the components is omitted.

5.1. Configuration of the First Cooling Devices

Figure 12:
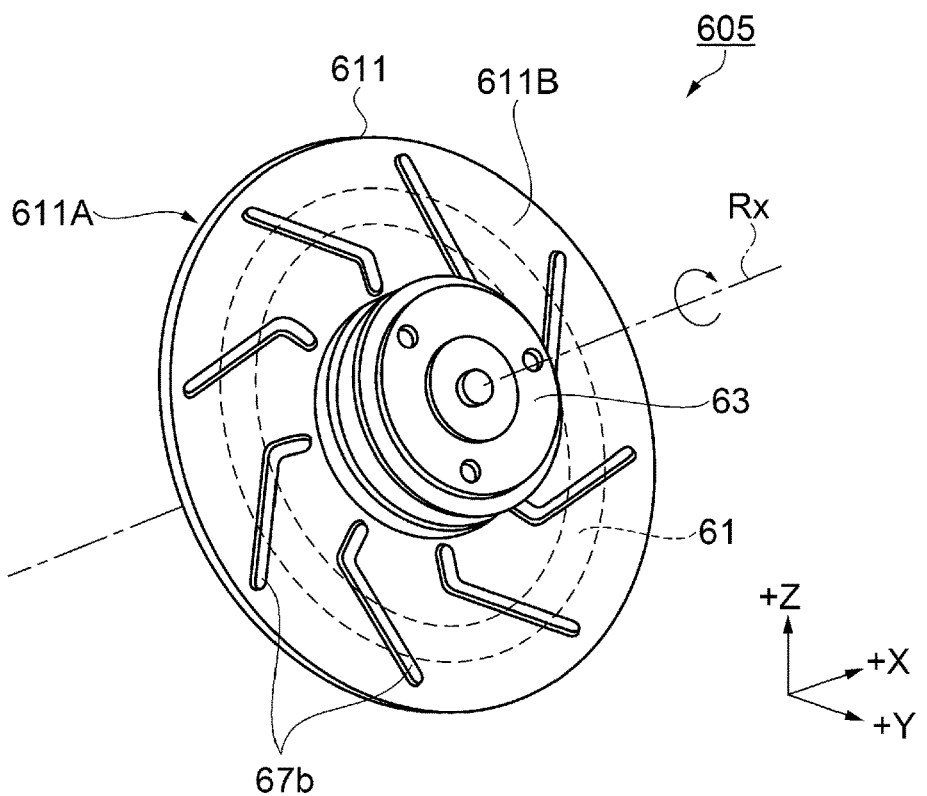
FIG. 12 is a perspective view showing the configuration of first cooling devices according to a fifth embodiment.

The configuration of a plurality of first cooling devices 67b in the wavelength conversion device 605 according to this embodiment is explained with reference to FIG. 12. FIG. 12 is a perspective view showing the configuration of the first cooling devices 67b according to the fifth embodiment.

As shown in FIG. 12, the wavelength conversion device 605 includes the plurality of first cooling devices 67b. Each of the plurality of first cooling devices 67b is bent in a plan view from the +X direction. Specifically, in the wavelength conversion device 605, on the second surface 611B of the supporting body 611, eight first cooling devices 67b are radially disposed from the rotation axis Rx side of the supporting body 611 toward the outer edge side of the supporting body 611. In the first cooling devices 67b, bent heat pipes are adopted instead of the first cooling devices 67a in the fourth embodiment. The first cooling devices 67b are formed flat in the ±X direction by the pressing explained above.

The first cooling devices 67b include, on the insides, not-shown spaces in which working fluid is encapsulated and cool the wavelength conversion device 605. The number of the first cooling devices 67b is not limited to eight. As a material forming the first cooling devices 67b, metal such as copper having thermal conductivity is adopted. The working fluid is encapsulated in the spaces of the first cooling devices 67b in a decompressed state. Accordingly, the working fluid evaporates at a low boiling point compared with the boiling point under the atmospheric pressure. Water can be adopted as the working fluid. A publicly-known heat pipe can be adopted as the first cooling devices 67b.

Although not shown in FIG. 12, the first cooling devices 67b include evaporators and condensers in the spaces on the inside. The evaporators include liquid retaining parts. The evaporators are disposed at the outer edge side of the spaces. The condensers are disposed at the rotation axis Rx side of the spaces.

The first cooling devices 67b are bent in a surface along the YZ plane by the bending. When seen through from the +X direction, the wavelength conversion element 61 on the first surface 611A and parts at the outer edge side in the first cooling devices 67b obliquely cross. Consequently, heat of the wavelength conversion element 61 is easily transferred to the evaporators of the first cooling devices 67b. In the wavelength conversion device 605, the supporting body 611 is turned clockwise and used in the plan view from the +X direction.

The pressing in the first cooling devices 67b is not essential. The pressing may be omitted when exchange of heat is sufficiently performed between the supporting body 611 and the first cooling devices 67b.

As explained above, with the wavelength conversion device 605 according to the fifth embodiment, the following effects can be obtained in addition to the effects in the fourth embodiment.

In the plan view from the +X direction of the wavelength conversion device 605, regions where the wavelength conversion element 61 and the plurality of first cooling devices 67b overlap are enlarged compared with the first cooling devices 67a in the fourth embodiment. In other words, the heat of the wavelength conversion element 61 can be easily transferred to the first cooling devices 67b.

The plurality of first cooling devices 67b of the wavelength conversion device 605 may respectively include not-shown cooling fins. In this case, heat radiation from the condensers of the respective plurality of first cooling devices 67b is facilitated by the cooling fins. Cooling efficiency of the plurality of first cooling devices 67b can be improved. The cooling fins may be separated from the respective plurality of first cooling devices 67b and attached to the first cooling devices 67b or may be integrated with the respective plurality of first cooling devices 67b.

6. Sixth Embodiment

In a sixth embodiment, a wavelength conversion device 606 included in the illumination device 41 of the projector 1 is explained with reference to the drawings. In the wavelength conversion device 606 according to this embodiment, a setting posture of first cooling devices is differentiated from that in the wavelength conversion device 605 in the fifth embodiment. Accordingly, the same components as the components in the fifth embodiment are denoted by the same reference numerals and signs and redundant explanation of the components is omitted.

6.1. Configuration of the First Cooling Devices

Figure 13:
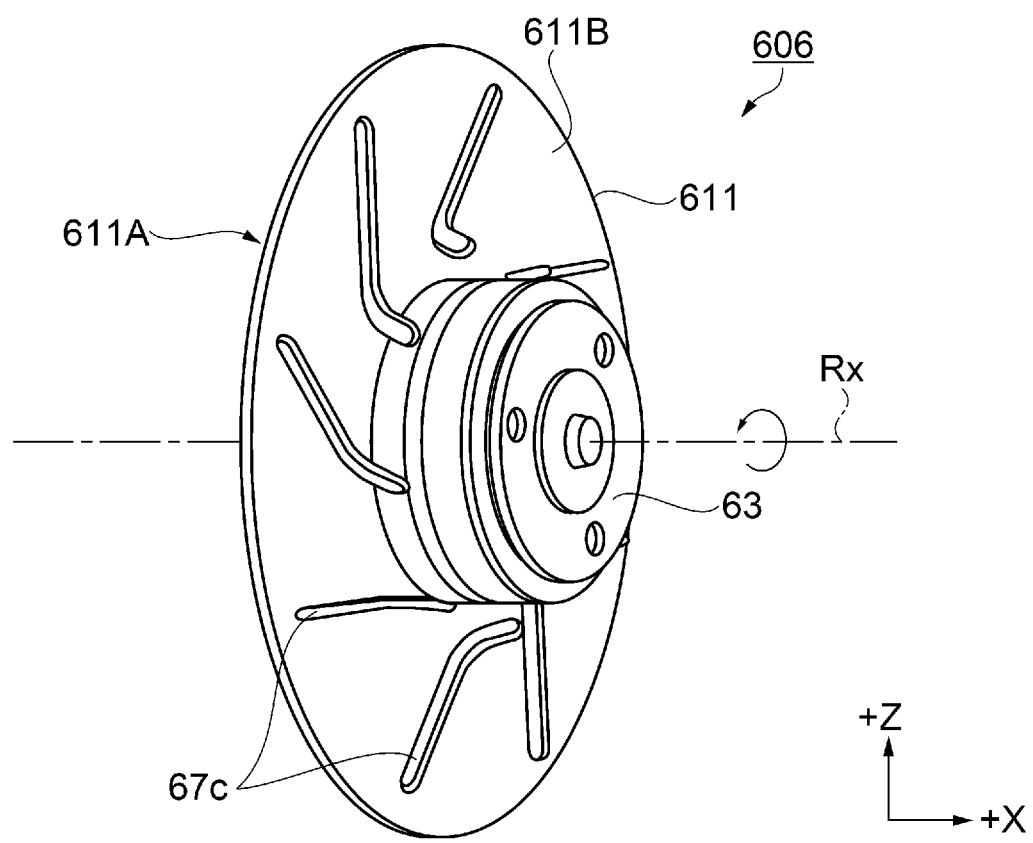
FIG. 13 is a perspective view showing the configuration of first cooling devices according to a sixth embodiment.

The configuration of a plurality of first cooling devices 67c in the wavelength conversion device 606 according to this embodiment is explained with reference to FIG. 13. FIG. 13 is a perspective view showing the configuration of the first cooling devices 67c according to the sixth embodiment.

As shown in FIG. 13, the wavelength conversion device 606 includes the plurality of first cooling devices 67c. The end portions at the rotation axis Rx side of the plurality of first cooling devices 67c are bent in a direction away from the second surface 611B of the supporting body 611 in the +X direction. Specifically, in the first cooling devices 67c, the same cooling devices as the first cooling devices 67b in the fifth embodiment are used. The first cooling devices 67c are set in a posture in which side surfaces with respect to flat surfaces are in contact with the second surface 611B. Therefore, in the first cooling devices 67c, the side surfaces are set in contact with the second surface 611B at the outer edge side of the first cooling devices 67c, whereby the end portions are separated from the second surface 611B at the rotation axis Rx side of the first cooling devices 67c. This setting posture is different from the setting posture in the fifth embodiment. In the wavelength conversion device 606, the supporting body 611 is turned counterclockwise in the plan view from the +X direction.

The plurality of first cooling devices 67c of the wavelength conversion device 606 may respectively include not-shown cooling fins. In this case, heat radiation from the condensers of the respective plurality of first cooling devices 67c is facilitated by the cooling fins. Cooling efficiency of the plurality of first cooling devices 67c can be improved. The cooling fins may be separated from the respective plurality of first cooling devices 67c and attached to the first cooling devices 67c or may be integrated with the respective plurality of first cooling devices 67c.

As explained above, with the wavelength conversion device 606 according to the sixth embodiment, the following effects can be obtained in addition to the effects in the fifth embodiment.

Heat is less easily propagated to the end portions of the first cooling devices 67c at the rotation axis Rx side from the supporting body 611. Accordingly, the change from the working fluid in the gas phase to the working fluid in the liquid phase is facilitated around the end portions in the spaces on the insides of the first cooling devices 67c. Consequently, it is possible further improve cooling efficiency for the first cooling devices 67c.

7. Seventh Embodiment

In a seventh embodiment, a wavelength conversion device 607 included in the illumination device 41 of the projector 1 is explained with reference to the drawings. In the wavelength conversion device 607 according to this embodiment, a first heat transfer member 671 and a second heat transfer member 672 are added to the wavelength conversion device 605 in the fifth embodiment. Accordingly, the same components as the components in the fifth embodiment are denoted by the same reference numerals and signs and redundant explanation of the components is omitted.

7.1. Configuration of the First Cooling Devices

Figure 14:
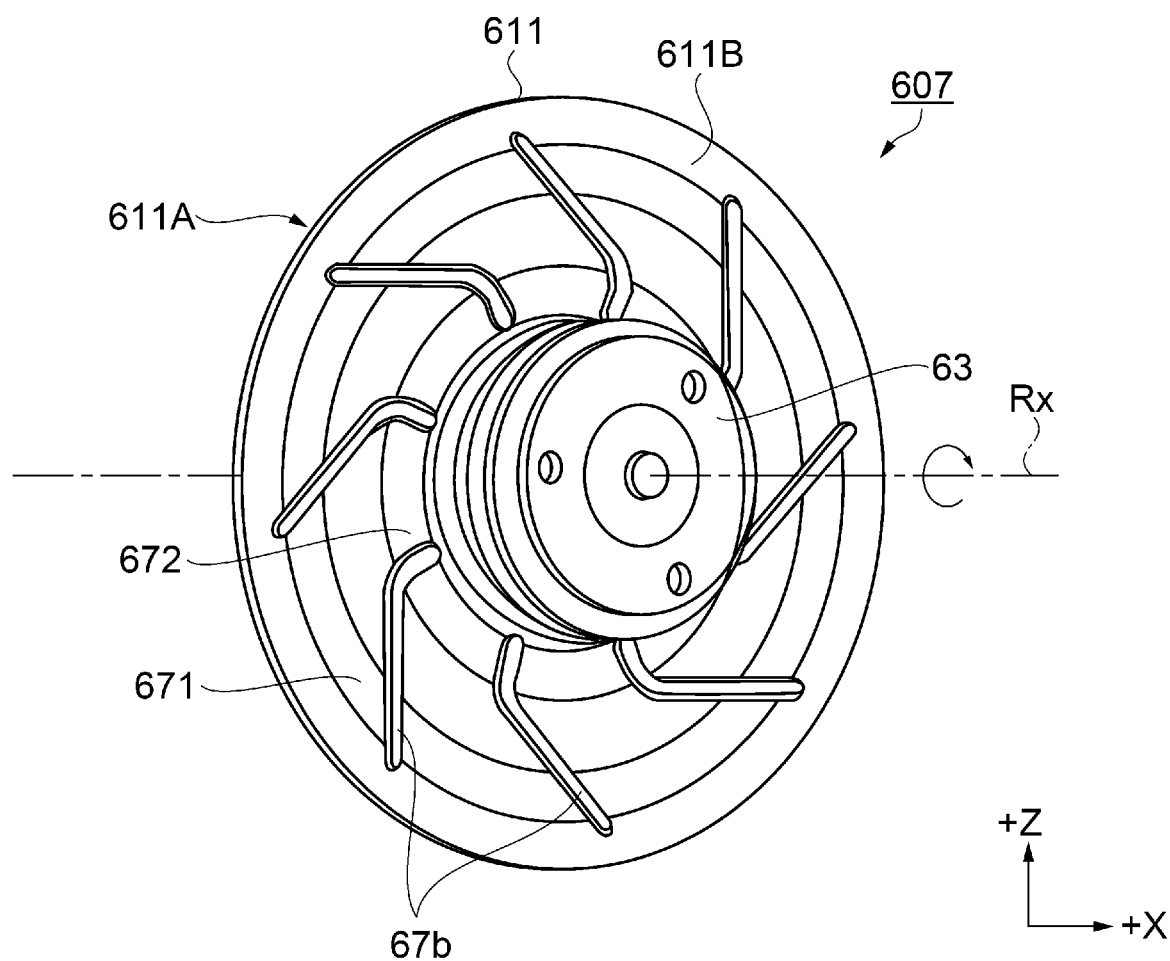
FIG. 14 is a perspective view showing the configuration of a wavelength conversion device according to a seventh embodiment.

The configuration of the wavelength conversion device 607 according to this embodiment is explained with reference to FIG. 14. FIG. 14 is a perspective view showing the configuration of the wavelength conversion device 607 according to the seventh embodiment.

The wavelength conversion device 607 includes, as shown in FIG. 14, the first heat transfer member 671 and the second heat transfer member 672. Specifically, the first heat transfer member 671 and the second heat transfer member 672 are annularly disposed between the plurality of first cooling devices 67b and the second surface 611B. The first heat transfer member 671 and the second heat transfer member 672 have a ring shape and are disposed to be rotationally symmetrical with respect to the rotation axis Rx of the supporting body 611. As a material forming the first heat transfer member 671 and the second heat transfer member 672, metal such as copper or aluminum having thermal conductivity is adopted. The first heat transfer member 671 and the second heat transfer member 672 are attached to the supporting body 611 and the plurality of first cooling devices 67b using brazing, an adhesive, or the like.

The first heat transfer member 671 is coupled to positions corresponding to not-shown evaporators in the first cooling devices 67b. In other words, the first heat transfer member 671 is coupled to the outer edge side of the first cooling devices 67b. The second heat transfer member 672 is coupled to parts at the rotation axis Rx side in the first cooling devices 67b. In other words, the plurality of first cooling devices 67b are not directly coupled to the second surface 611B of the supporting body 611 and are coupled to the second surface 611B via the first heat transfer member 671 and the second heat transfer member 672. In other words, the plurality of first cooling devices 67b are coupled to the first heat transfer member 671 and the second heat transfer member 672 and disposed with gaps between the first cooling devices 67b and the second surface 611B. When the wavelength conversion device 607 is assembled, first, the plurality of first cooling devices 67b are attached to the first heat transfer member 671 and the second heat transfer member 672 to forma subunit. Thereafter, the subunit is attached to the supporting body 611. Consequently, assemblability can be improved.

Although not shown in FIG. 14, the wavelength conversion device 607 may further include a cooling fin disposed in the second heat transfer member 672.

As in the wavelength conversion device 605 in the fifth embodiment, the plurality of first cooling devices 67b of the wavelength conversion device 607 may respectively include not-shown cooling fins. In this case, heat radiation from the condensers of the respective plurality of first cooling devices 67b is facilitated by the cooling fins. The cooling efficiency of the plurality of first cooling devices 67b can be further improved.

As explained above, with the wavelength conversion device 607 according to the seventh embodiment, the following effects can be obtained in addition to the effects in the fifth embodiment.

Deviation of a distribution of heat is reduced among the respective evaporators included in the plurality of first cooling devices 67b. Deviation of a distribution of heat is also reduced among the respective condensers included in the plurality of first cooling devices 67b. Accordingly, the plurality of first cooling devices 67b easily uniformly operate. The cooling efficiency for the wavelength conversion element 61 can be further improved.

When a cooling fin is disposed in the second heat transfer member 672, heat radiation from the condensers of the respective plurality of first cooling devices 67b is facilitated by the cooling fin. The cooling efficiency of the plurality of first cooling devices 67b can be further improved.

8. Eighth Embodiment

In an eighth embodiment, a wavelength conversion device 608a included in the illumination device 41 of the projector 1 is explained with reference to the drawings. In the wavelength conversion device 608a according to this embodiment, cooling fins 680 are added to the first cooling device 64 in the first embodiment. Accordingly, the same components as the components in the first embodiment are denoted by the same reference numerals and signs and redundant explanation of the components is omitted.

8.1. Configuration of the First Cooling Device

The configuration of a first cooling device 68 in the wavelength conversion device 608a according to this embodiment is explained with reference to FIGS. 15 and 16.

Figure 15:
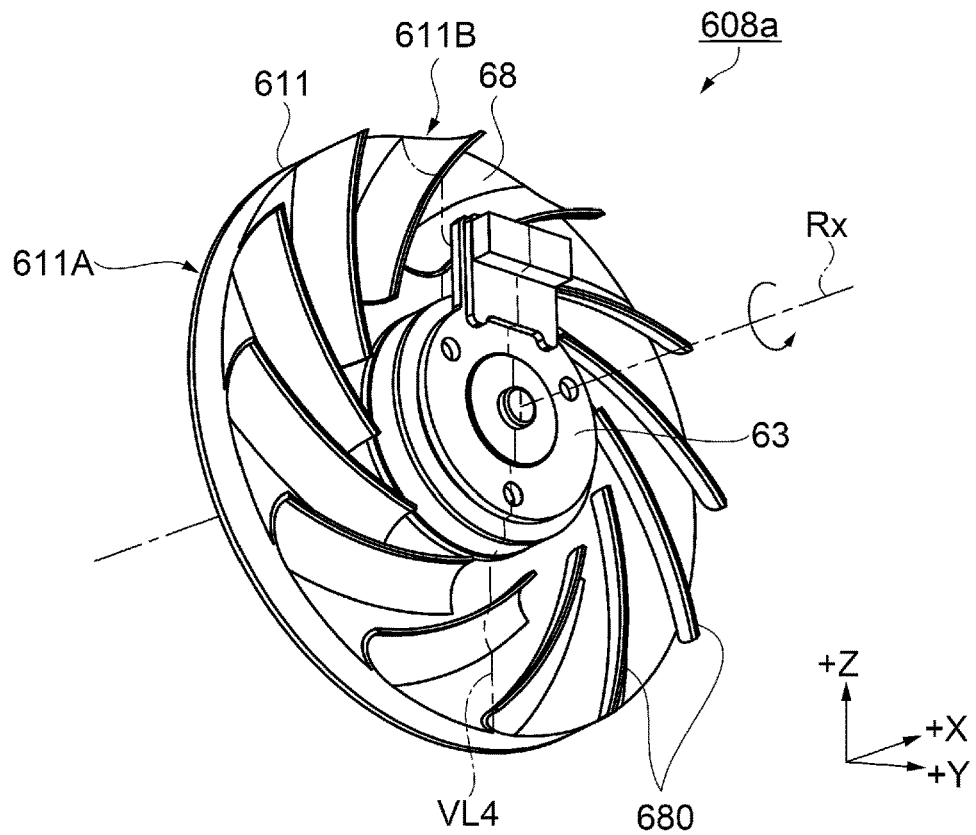
FIG. 15 is a perspective view showing the configuration of a first cooling device according to an eighth embodiment.

FIG. 15 is a perspective view showing the configuration of the first cooling device 68 according to the eighth embodiment. FIG. 16 is a sectional schematic view showing the configuration of the first cooling device 68. FIG. 16 shows a cross section of a dividing surface VL4 shown in FIG. 15 viewed from the −Y direction.

Figure 16:
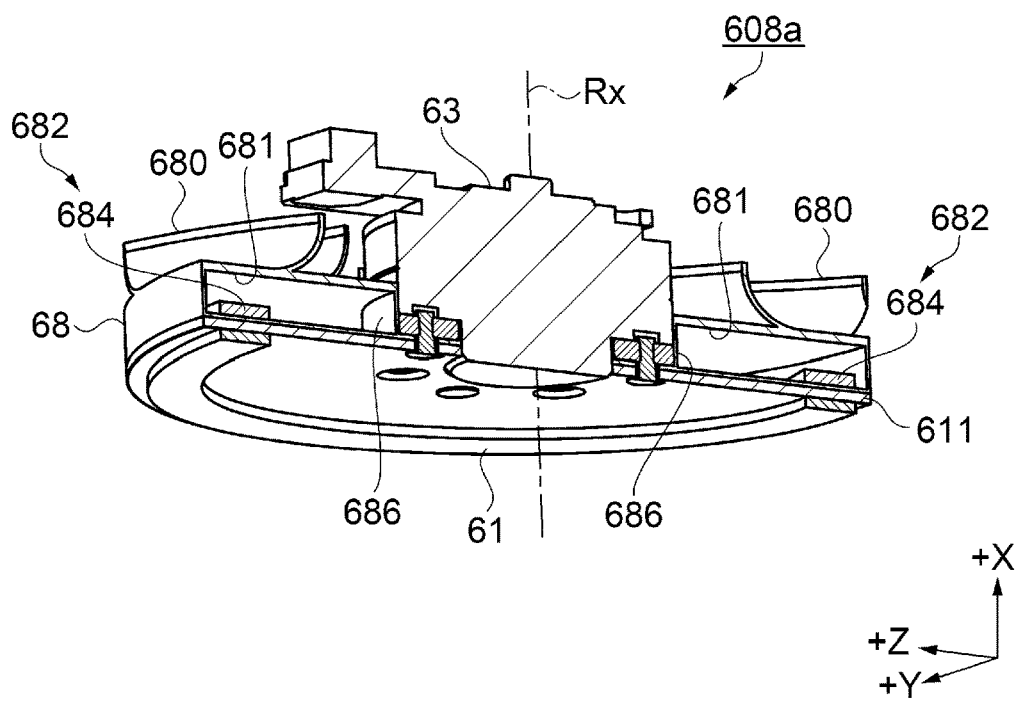
FIG. 16 is a sectional schematic view showing the configuration of the first cooling device.

As shown in FIGS. 15 and 16, the wavelength conversion device 608a includes the first cooling device 68. The first cooling device 68 includes, on the inside, a space 681 in which working fluid is encapsulated and a plurality of cooling fins 680. The plurality of cooling fins 680 are provided on the +X direction side of the first cooling device 68.

As the plurality of cooling fins 680, as shown in FIG. 15, twelve cooling fins 680 are radially formed at the outer circumference side of the rotating device 63 from the rotation axis Rx side of the supporting body 611 toward the outer edge side of the supporting body 611. Each of the plurality of cooing fins 680 is obliquely disposed to cross the normal of the outer edge of the supporting body 611 in the plan view from the +X direction.

The plurality of cooling fins 680 are designed such that, when the supporting body 611 turns counterclockwise in the plan view from the +X direction, air is fed from the rotating device 63 side to the outer edge side of the supporting body 611 and discharged by the plurality of cooling fins 680. Consequently, heated air less easily flows to the rotating device 63. Overheat of the rotating device 63 can be suppressed. The disposition of the plurality of cooling fins 680 only has to be designed according to a direction in which the supporting body 611 turns. The disposition is not limited to the above. The number of the cooling fins 680 is not limited to the above.

As shown in FIG. 16, the first cooling device 68 include the space 681 on the inside. A cross section along the XZ plane of the space 681 is substantially rectangular. The space 681 is disposed with the longitudinal direction thereof being in contact with the supporting body 611. The space 681 is a space communicating in a ring shape. The first cooling device 68 includes, in the space 681, an evaporator 682 and an condenser 686. A liquid retaining part 684 is provided in the evaporator 682 disposed at the outer edge side of the space 681. The condenser 686 includes a region at the rotation axis Rx side of the space 681. Accordingly, when air is discharged from the rotating device 63 side to the outer edge side of the supporting body 611 by the plurality of cooling fins 680, the rotating device 63 side is cooled and heat radiation in the condenser 686 is facilitated. As the working fluid, the same substance as the substance in the first embodiment can be adopted. As the liquid retaining part 684, the same configuration as the configuration in the first embodiment can be adopted.

The plurality of cooling fins 680 are designed such that the sectional shape of the cooling fins 680 is bent and an amount of the air discharged during the turning of the supporting body 611 increases. Such a shape of the plurality of cooling fins 680 can be formed by skiving for a main body of the first cooling device 68.

Figure 17:
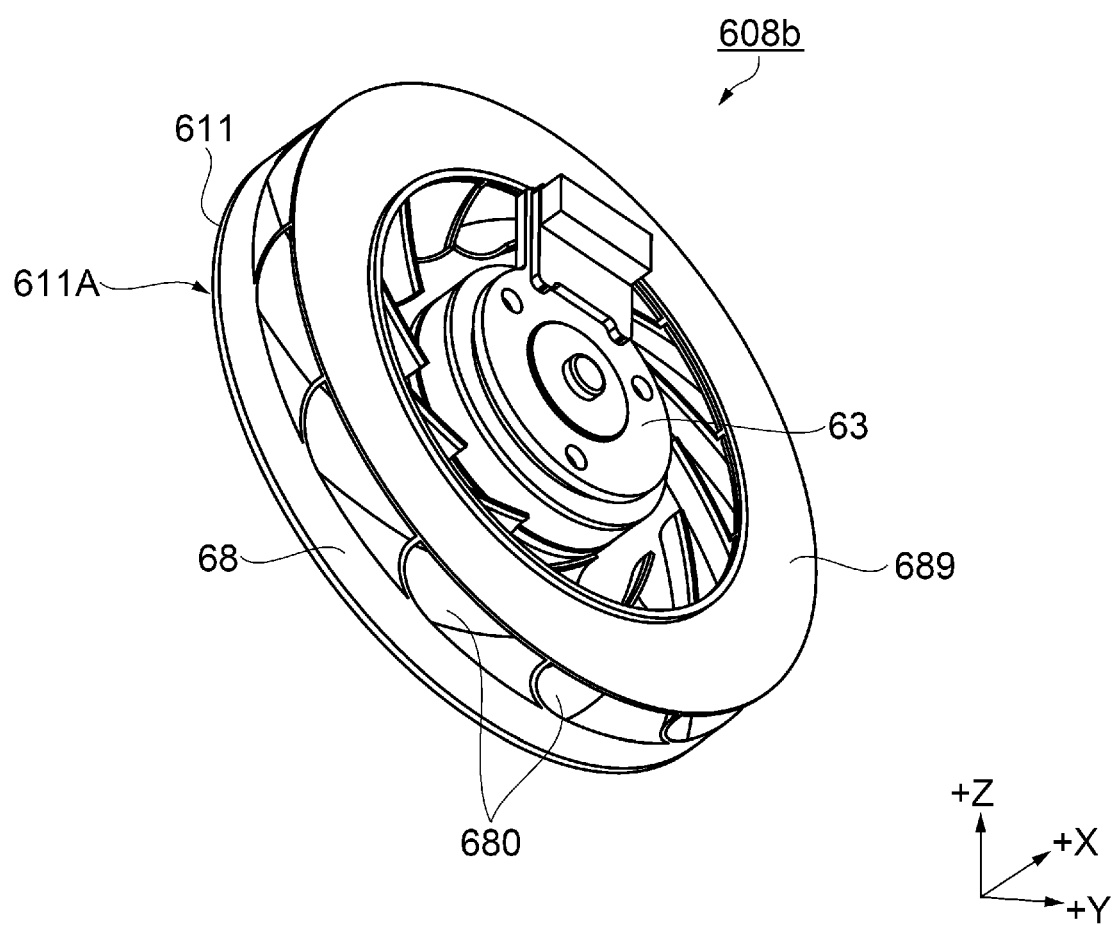
FIG. 17 is a perspective view showing another configuration of the first cooling device.

A wavelength conversion device 608b, which is another configuration of the wavelength conversion device 608a in the eighth embodiment, is explained with reference to FIG. 17. FIG. 17 is a perspective view showing the other configuration of the first cooling device 68.

The wavelength conversion device 608b according to the eighth embodiment is different from the wavelength conversion device 608a in that a ring is attached to the first cooling device 68. Accordingly, the same components as the components of the wavelength conversion device 608a are denoted by the same reference numerals and signs and redundant explanation of the components is omitted.

In the wavelength conversion device 608b, as shown in FIG. 17, a flat ring 689 is attached to the first cooling device 68. Specifically, the ring 689 is disposed at the +X direction side of the plurality of cooling fins 680. In the plan view from the +X direction, the outer edge of the ring 689 substantially overlaps the outer edge of the supporting body 611. On the rotating device 63 side, which is the ring 689 inner side, the rotating device 63 and a part of the plurality of cooling fins 680 are exposed to the +X direction side.

Consequently, when the supporting body 611 turns, a flow of the air discharged from the rotating device 63 side is aligned and the discharge of the air is facilitated.

As explained above, with the wavelength conversion devices 608a and 608b according to the eighth embodiment, the following effects can be obtained in addition to the effects in the first embodiment.

The heat radiation from the condenser 686 of the first cooling device 68 is facilitated by the plurality of cooling fins 680. Cooling efficiency of the first cooling device 68 can be improved.

Since the ring 689 is attached to the first cooling device 68, the discharge of the air from the rotating device 63 side is facilitated. The cooling efficiency of the first cooling device 68 can be further improved.

9. Ninth Embodiment

In this embodiment, a wavelength conversion device 609 included in the illumination device 41 of the projector is explained with reference to the drawings. In the wavelength conversion device 609 according to this embodiment, a second cooling device 69 is added to the first cooling device 64 in the first embodiment. Accordingly, the same components as the components in the first embodiment are denoted by the same reference numerals and signs and redundant explanation of the components is omitted.

9.1. Configuration of the Wavelength Conversion Device

Figure 18:
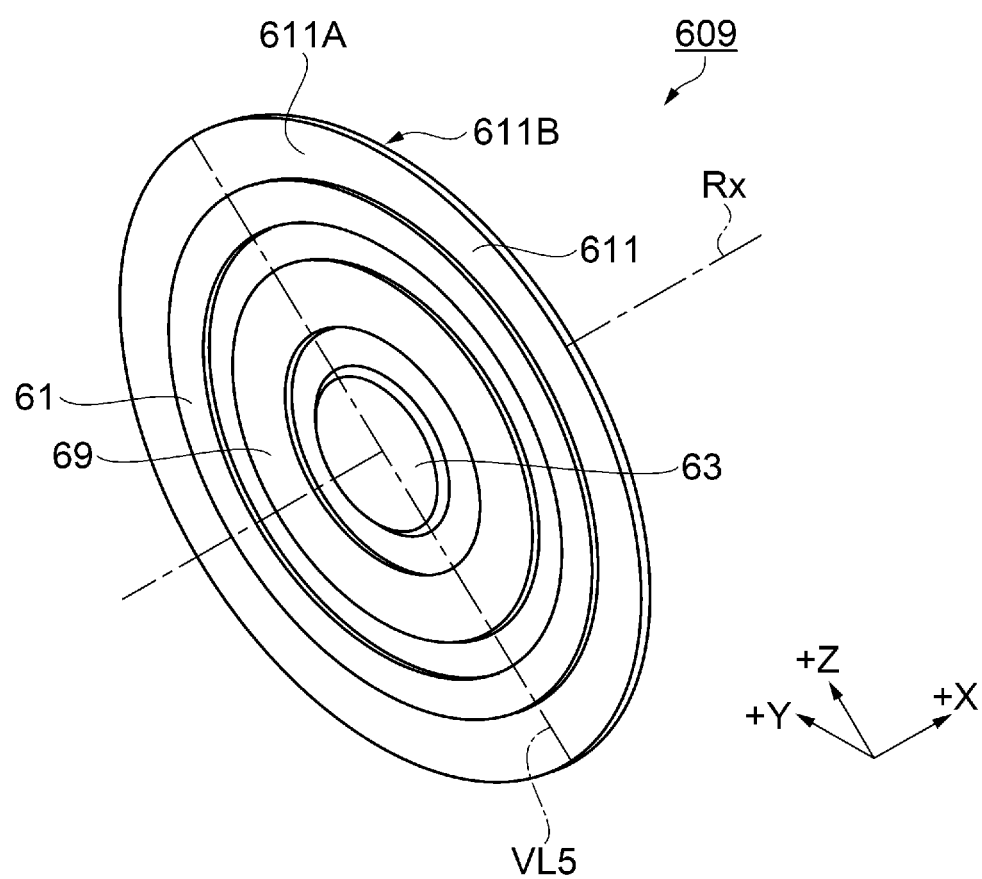
FIG. 18 is a perspective view showing the configuration of a wavelength conversion device according to a ninth embodiment.
Figure 19:
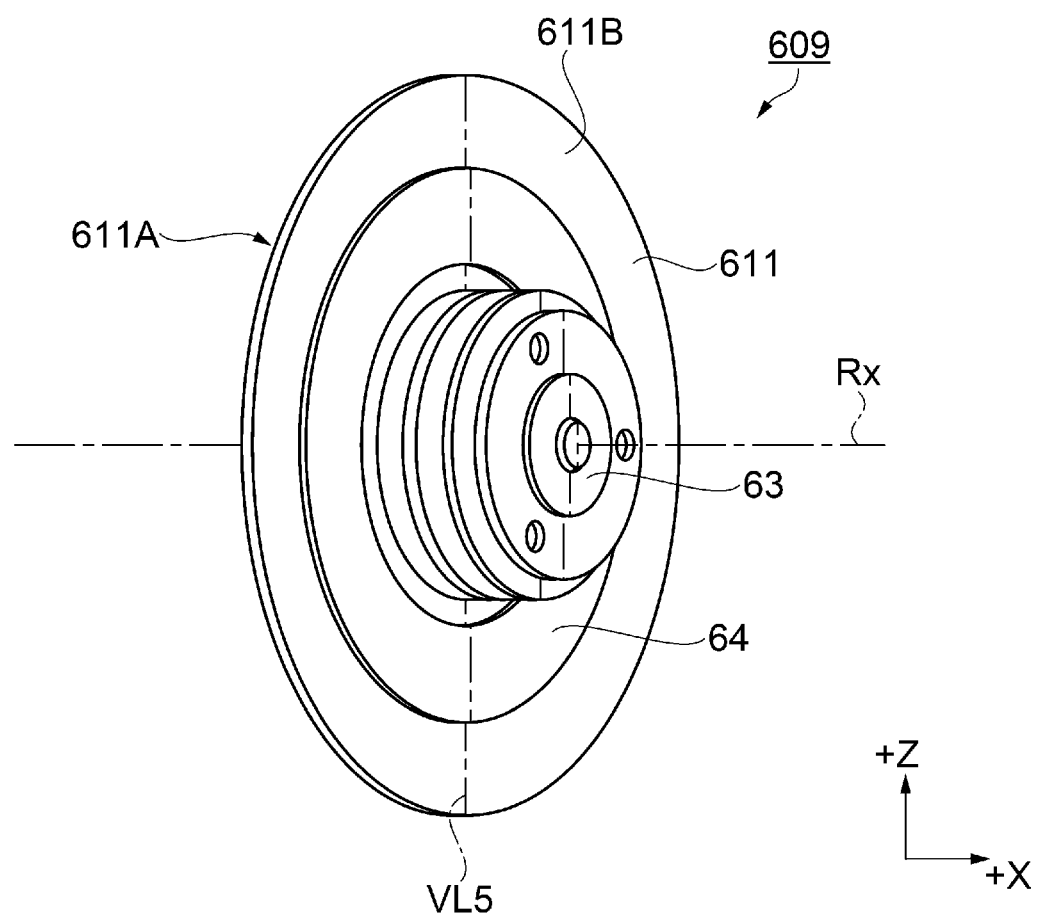
FIG. 19 is a perspective view showing the configuration of the wavelength conversion device.
Figure 20:
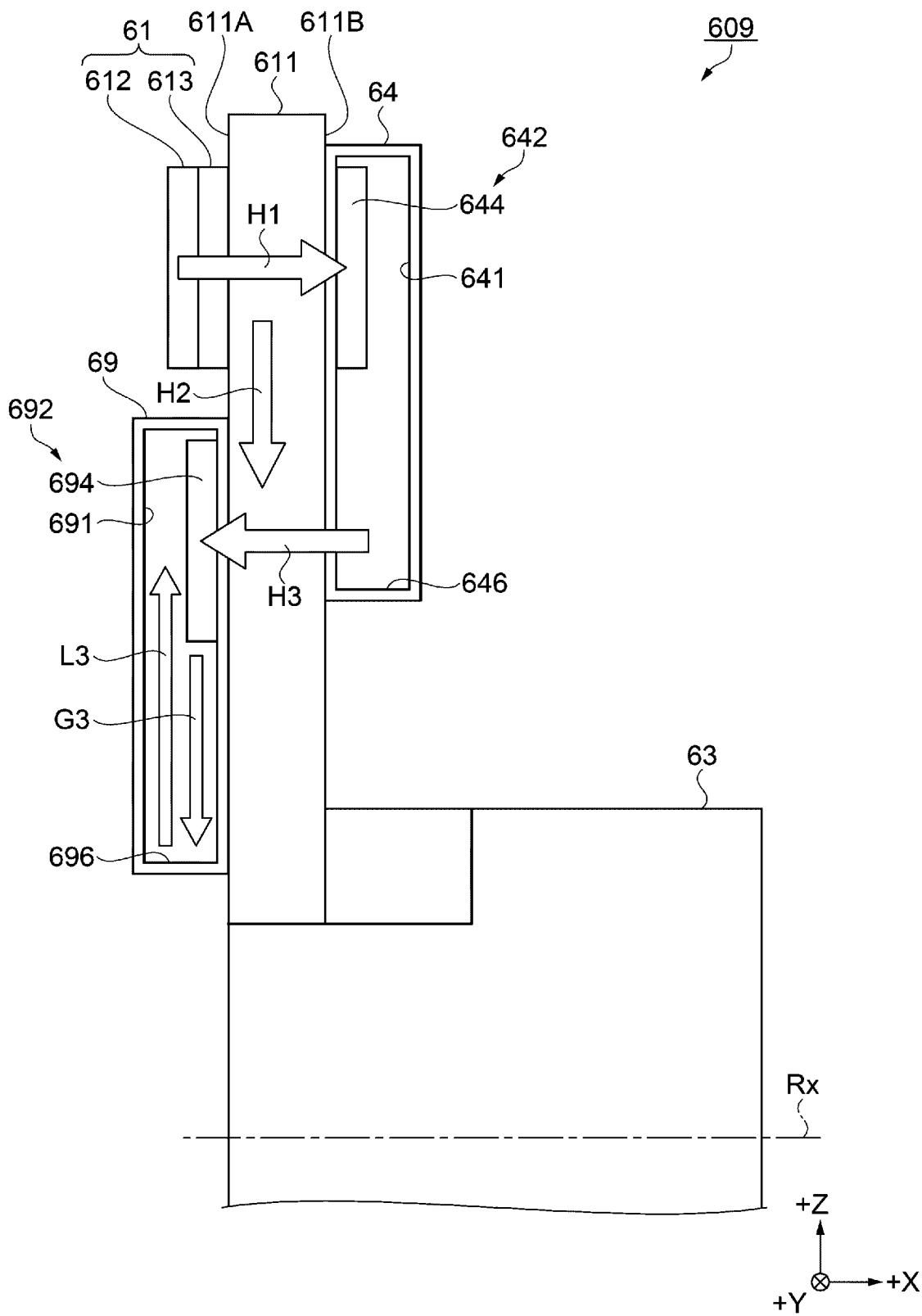
FIG. 20 is a sectional schematic view showing the configuration of the wavelength conversion device.

The configuration of the wavelength conversion device 609 according to this embodiment is explained with reference to FIGS. 18, 19, and 20. FIGS. 18 and 19 are perspective views showing the configuration of the wavelength conversion device 609 according to the ninth embodiment. FIG. 20 is a sectional schematic view showing the configuration of the wavelength conversion device 609. FIG. 20 shows a cross section of a dividing surface VL5 shown in FIGS. 18 and 19 viewed from the −Y direction.

As shown in FIGS. 18 and 19, the wavelength conversion device 609 further includes the second cooling device 69 provided on the first surface 611A. The second cooling device 69 is annularly disposed at the rotation axis Rx side with respect to the wavelength conversion element 61. The second cooling device 69 is formed in a ring shape in the plan view from the −X direction. Like the wavelength conversion element 61 and the first cooling device 64, the second cooling device 69 is disposed on the first surface 611A of the supporting body 611 to be rotationally symmetrical with respect to the rotation axis Rx.

The second cooling device 69 includes, on the inside of a housing thereof, a space 691 in which working fluid is encapsulated and receives heat from the first cooling device 64. The second cooling device 69 includes, as shown in FIG. 20, in the space 691, an evaporator 692 including a liquid retaining part 694 and a condenser 696. The second cooling device 69 is disposed such that the evaporator 692 corresponds to a part on the rotation axis side of the first cooling device 64. In other words, the liquid retaining part 694 of the second cooling device 69 is disposed in a part not overlapping, in the ±X direction, a part where the liquid retaining part 644 of the first cooling device 64 is disposed.

The space 691 extends to the rotation axis Rx side from the outer edge side of the substantially disk-shaped supporting body 611. The sectional shape along the XZ plane of the space 691 is a substantially rectangular shape, the dimension in the ±Z direction of which is relatively large, in FIG. 20. Although not shown in FIG. 20, the space 691 is provided to communicate in a ring shape along the external shape of the ring-shaped second cooling device 69. As the second cooling device 69, the same material as the material forming the first cooling device 64 is adopted.

The working fluid is encapsulated in the space 691 in a decompressed state. Accordingly, the working fluid evaporates at a low boiling point compared with the boiling point under the atmospheric pressure. Water can be adopted as the working fluid.

The evaporator 692 evaporates the working fluid in the liquid phase with heat transferred from the wavelength conversion element 61 via the first cooling device 64 and changes the working fluid in the liquid phase to the working fluid in the gas phase. The evaporator 692 includes the liquid retaining part 694 that retains the working fluid in the liquid phase. The evaporator 692 is a part including a region where the liquid retaining part 694 is disposed. The condenser 696 condenses the working fluid in the gas phase and changes the working fluid in the gas phase to the working fluid in the liquid phase. The condenser 696 includes a region at the rotation axis Rx side in the space 691.

The liquid retaining part 694 has a ring-like external shape. The working fluid in the liquid phase permeates and is retained in the liquid retaining part 694. Accordingly, as the liquid retaining part 694, a porous body including a plurality of holes or a molded body of fiber is adopted such that the working fluid in the liquid phase permeates. As the liquid retaining part 694, the same configuration as the configuration of the liquid retaining part 644 of the first cooling device 64 can be adopted.

The positions of the part of the evaporator 692 and the part of the condenser 696 excluding the liquid retaining part 694 change depending on an operation state or the like of the second cooling device 69. In this embodiment, the liquid retaining part 694 is disposed only on a wall surface at the +X direction side in the space 691. However, the disposition of the liquid retaining part 694 is not limited to this.

With these configurations, heat H1 transferred from the wavelength conversion element 61 to the first cooling device 64 is radiated by the condenser 646 of the first cooling device 64 and thereafter transferred to the second cooling device 69 via the supporting body 611 as heat H3. A part of the heat of the wavelength conversion element 61 is directly transferred to the second cooling device 69 via the supporting body 611 as heat H2.

The heat H2 and the heat H3 transferred to the second cooling device 69 are transferred to the evaporator 692 in the space 691. The evaporator 692 evaporates, with the heat H2 and the heat H3 transferred from the wavelength conversion element 61, the working fluid in the liquid phase retained in the liquid retaining part 694 and changes the working fluid in the liquid phase to the working fluid in the gas phase. At this time, the heat H2 and the heat H3 are absorbed by the heat of vaporization of the working fluid in the liquid phase in the space 691. Consequently, heat radiation in the condenser 646 of the first cooling device 64 is facilitated. In addition, the wavelength conversion element 61 is directly cooled via the supporting body 611.

The working fluid change from the liquid phase to the gas phase retains the heat H2 and the heat H3 transferred from the wavelength conversion element 61, moves in the −Z direction mainly as a flow G3, and reaches the condenser 696. The condenser 696 condenses the working fluid in the gas phase and changes the working fluid in the gas phase to the working fluid in the liquid phase. At this time, the working fluid in the gas phase radiates heat and condenses. The heat radiated from the working fluid in the gas phase is radiated to the outside of the second cooling device 69 from the condenser 696.

The working fluid changed from the gas phase to the liquid phase moves to the outer edge side of the supporting body 611, that is, the evaporator 692 in the +Z direction in FIG. 20 mainly as a flow L3. During the operation of the second cooling device 69, since the rotating device 63 is turning the supporting body 611, a centrifugal force is generated to the outer edge side of the supporting body 611, in other words, in the +Z direction in FIG. 20. Consequently, the centrifugal force acts on the working fluid changed from the gas phase to the liquid phase. The movement of the working fluid in the +Z direction is facilitated. The working fluid in the liquid phase moved to the evaporator 692 is retained by the liquid retaining part 694. In this way, like the first cooling device 64, the second cooling device 69 is a so-called vapor chamber. The second cooling device 69 enables cooling by transfer of heat by continuously and repeatedly expressing the evaporation and the condensation of the working fluid.

The flows G3 and L3 indicate main lines of flow of the working fluid. The flow of the working fluid is not limited to the flows G3 and L3. For example, the working fluid in the gas phase generated in the liquid retaining part 694 may be condensed on the inner wall opposed to the liquid retaining part 694 in the ±X direction in the space 691.

Like the liquid retaining part 644 of the first cooling device 64, the liquid retaining part 694 is not provided at the end portion on the rotation axis Rx side in the space 691. The liquid retaining part 694 is not provided on the inner wall at the −X direction side in the space 691. Further, the liquid retaining part 694 is not provided between the end portion at the rotation axis Rx side and a portion substantially in the middle in the ±Z direction of the second cooling device 69 on the inner wall at the +X direction side in the space 691. A centrifugal force toward the outer edge side is generated by the rotation of the wavelength conversion device 609. With the centrifugal force, the working fluid changed from the gas phase to the liquid phase moves toward the evaporator 692 located at the outer edge side, that is, toward the liquid retaining part 694. At this time, since a liquid retaining part is absent in a path on which the working fluid in the liquid phase receives the centrifugal force and moves, compared with when the liquid retaining part is present in the path, it is possible to more quickly move the working fluid in the liquid phase to the liquid retaining part 694 of the evaporator 692. Therefore, a cycle of the change from the gas phase to the liquid phase and to the gas phase of the working fluid efficiently progresses in the second cooling device 69. Consequently, it is possible to further improve the cooling efficiency for the wavelength conversion element 61 by the first cooling device 64.

In the wavelength conversion device 609 in this embodiment, at least one of the first cooling device 64 and the second cooling device 69 may include a cooling fin. The cooling efficiency for the wavelength conversion element 61 can be further improved by the cooling fin. Examples of the cooling fin include the plurality of cooling fins 680 in the eighth embodiment.

As explained above, with the wavelength conversion device 609 according to the ninth embodiment, the following effects can be obtained in addition to the effects in the first embodiment.

The cooling efficiency for the wavelength conversion element 61 can be further improved by the second cooling device 69. Specifically, the heat H3 from the condenser 646 of the first cooling device 64 is easily transferred to the evaporator 692 of the second cooling device 69. Accordingly, the heat radiation from the condenser 646 of the first cooling device 64 is facilitated. The cooling efficiency of the first cooling device 64 can be further improved.

The heat H2 is directly transferred from the wavelength conversion element 61 to the second cooling device 69 not via the first cooling device 64. Consequently, the cooling efficiency for the wavelength conversion element 61 can be further improved.

The second cooling device 69 of the wavelength conversion device 609 in this embodiment is applicable to the wavelength conversion devices in the embodiments explained above. For example, the wavelength conversion device 6 in the first embodiment, the wavelength conversion device 602 in the second embodiment, the wavelength conversion device 603 in the third embodiment, the wavelength conversion device 604 in the fourth embodiment, and the wavelength conversion device 605 in the fifth embodiment may further include the second cooling device 69 in this embodiment. Consequently, the heat radiation from the condenser 646 of the first cooling device 64 is facilitated. The cooling efficiency of the first cooling device 64 can be further improved.

Contents derived from the embodiments are explained below.

A wavelength conversion device includes: a rotating device; a substrate including a first surface and a second surface disposed at an opposite side of the first surface, the substrate being rotated by the rotating device; a wavelength conversion element provided on the first surface and configured to convert a wavelength of light made incident thereon; and a first cooling device provided on the second surface, including, on an inside, a space in which working fluid is encapsulated, the first cooling device cooling the wavelength conversion element. The first cooling device is disposed in a position corresponding to the wavelength conversion element. The space extends from an outer edge side of the substrate to a rotation axis side. The first cooling device includes, in the space, an evaporator configured to evaporate the working fluid in a liquid phase with heat transferred from the wavelength conversion element and change the working fluid in the liquid phase to the working fluid in a gas phase and a condenser configured to condense the working fluid in the gas phase and change the working fluid in the gas phase to the working fluid in the liquid phase. The evaporator includes a liquid retaining part configured to retain the working fluid in the liquid phase. The liquid retaining part is provided at the outer edge side in the space and disposed in the position corresponding to the wavelength conversion element.

With this configuration, it is possible to improve cooling efficiency for the wavelength conversion element, which is a phosphor from that in the past, without increasing the wavelength conversion device in size. Specifically, the first cooling device is provided in the position corresponding to the wavelength conversion element across the substrate. In the first cooling device, the liquid retaining part is disposed in the position corresponding to the wavelength conversion element. Therefore, the heat of the wavelength conversion element is transferred mainly to the liquid retaining part. Since the working fluid in the liquid phase is retained by the liquid retaining part, the working fluid in the liquid phase evaporates with the transferred heat and changes to the working fluid in the gas phase. The heat of the wavelength conversion element is absorbed and the wavelength conversion element is cooled by the heat of vaporization of the working fluid in the liquid phase at this time.

In the first cooling device, the working fluid changed from the liquid phase to the gas phase in the liquid retaining part moves to the condenser. At this time, the heat transferred from the wavelength conversion element is also transferred from the evaporator to the condenser by the working fluid in the gas phase. In the condenser, the working fluid in the gas phase radiates heat and condenses and changes from the working fluid in the gas phase to the working fluid in the liquid phase. The heat radiated by the condensation of the working fluid is radiated from the first cooling device.

The space of the first cooling device extends from the outer edge side to the rotation axis side of the substrate. The liquid retaining part is provided at the outer edge side of the space. Accordingly, the working fluid in the liquid phase condensed at the rotation axis side in the space of the condenser easily moves from the rotation axis side to the outer edge side with a centrifugal force generated by the rotation of the substrate. That is, after changing from the working fluid in the gas phase, the working fluid in the liquid phase is quickly returned to the liquid retaining part compared with when the centrifugal force does not act. Therefore, a cycle of the change from the gas phase to the liquid phase and to the gas phase of the working fluid efficiently progresses. Consequently, the cooling efficiency of the first cooling device increases. It is possible to improve the cooling efficiency for the wavelength conversion element. In other words, it is possible to provide the wavelength conversion device with improved cooling efficiency for the wavelength conversion element from that in the past.

In the wavelength conversion device, the first cooling device may be provided along a shape of the wavelength conversion element.

With this configuration, since the shape of the first cooling device conforms to the shape of the wavelength conversion element, the heat of the wavelength conversion element is easily transferred to the first cooling device. Accordingly, it is possible to further improve the cooling efficiency for the wavelength conversion element.

In the wavelength conversion device, the liquid retaining part may not be provided at an end portion at the rotation axis side in the space.

With this configuration, the working fluid changed from the gas phase to the liquid phase at the end portion of the space of the first cooling device easily moves to the position corresponding to the wavelength conversion element with the centrifugal force generated by the rotation of the substrate. Accordingly, it is possible to cause the cycle of the change from the gas phase to the liquid phase and to the gas phase of the working fluid in the first cooling device to more efficiently progress.

In the wavelength conversion device, when a direction from the first surface to the second surface along the rotation axis is represented as a first direction, the first cooling device may include, in a part located in the first direction, an inclined surface inclined such that length of the space along the first direction increases from the outer edge side toward the rotation axis side.

With this configuration, in the space, the outer edge side of the substrate is formed narrow with respect to the rotation axis side of the substrate. Accordingly, the condenser is wider with respect to the evaporator including the liquid retaining part. The working fluid in the gas phase easily condenses. In other words, the working fluid in the gas phase easily radiates heat. The working fluid in the liquid phase changed from the working fluid in the gas phase easily moves to the liquid retaining part along the inclined surface. Consequently, it is possible to further improve the cooling efficiency of the first cooling device.

In the wavelength conversion device, when a direction from the first surface to the second surface along the rotation axis is represented as a first direction, the first cooling device may include, in a part located in the first direction, a plurality of fins disposed along a rotating direction of the substrate, and a plurality of grooves may be radially provided in the plurality of fins from the rotation axis side toward the outer edge side.

With this configuration, the working fluid in the liquid phase easily moves to the liquid retaining part along the inner surface at the space side of the fins with the centrifugal force generated by the rotation of the substrate. The fins are divided by the grooves and the surface areas of the fins are enlarged. The air easily flows to the grooves according to the rotation of the substrate. Accordingly, the heat radiation from the first cooling device is facilitated. Consequently, it is possible to further improve the cooling efficiency of the first cooling device.

In the wavelength conversion device, a plurality of the first cooling devices may be provided, and the plurality of first cooling devices may respectively extend from the rotation axis side to the outer edge side.

With this configuration, it is possible to improve the cooling efficiency for the wavelength conversion element and reduce the first cooling device in size.

In the wavelength conversion device, the plurality of first cooling devices may be bent.

With this configuration, in a plan view from the first direction of the wavelength conversion device, a region where the wavelength conversion element and the plurality of first cooling devices overlap is enlarged. In other words, it is possible to easily transfer the heat of the wavelength conversion element to the first cooling device.

In the wavelength conversion device, end portions at the rotation axis side of the plurality of first cooling devices may be bent in a direction away from the substrate.

With this configuration, heat is less easily propagated to the end portions at the rotation axis side of the first cooling devices from the substrate. Accordingly, the change from the working fluid in the gas phase to the working fluid in the liquid phase is facilitated around the end portions in the spaces of the first cooling devices. Consequently, it is possible to further improve the cooling efficiency of the first cooling devices.

The wavelength conversion device may further include: a first heat transfer member coupled to a position corresponding to the evaporators in the plurality of first cooling devices; and a second heat transfer member coupled to parts at the rotation axis side in the plurality of first cooling devices.

With this configuration, deviation of a distribution of heat is reduced among the respective evaporators included in the plurality of first cooling devices. Deviation of a distribution of heat is also reduced among the respective condensers included in the plurality of first cooling devices. Accordingly, the plurality of first cooling devices easily equally operate. It is possible to further improve the cooling efficiency for the wavelength conversion element.

The wavelength conversion device may further include a cooling fin disposed in the second heat transfer member.

With this configuration, heat radiation from the condensers of the plurality of first cooling devices is facilitated by the cooling fin. It is possible to further improve the cooling efficiency of the plurality of first cooling devices.

In the wavelength conversion device, the first cooling device may include a cooling fin.

With this configuration, heat radiation from the condenser of the first cooling device is facilitated by the cooling fin. It is possible to further improve the cooling efficiency of the first cooling device.

The wavelength conversion device may further include a second cooling device provided on the first surface. The second cooling device may include, on an inside, a space in which the working fluid is encapsulated, include, in the space, an evaporator configured to evaporate the working fluid in the liquid phase with the heat transferred from the wavelength conversion element and change the working fluid in the liquid phase to the working fluid in the gas phase and a condenser configured to condense the working fluid in the gas phase and change the working fluid in the gas phase to the working fluid in the liquid phase. The second cooling device may be disposed such that the evaporator of the second cooling device corresponds to a part on the rotation axis side of the first cooling device.

With this configuration, the cooling efficiency for the wavelength conversion element can be further improved by the second cooling device. Specifically, heat transferred from the condenser of the first cooling device is easily transferred to the evaporator of the second cooling device. Accordingly, heat radiation from the condenser of the first cooling device is facilitated. It is possible to further improve the cooling efficiency of the first cooling device.

In the wavelength conversion device, the second cooling device may be disposed at the rotation axis side with respect to the wavelength conversion element.

With this configuration, heat is directly transferred from the wavelength conversion element to the second cooling device not via the first cooling device. Consequently, it is possible to further improve the cooling efficiency for the wavelength conversion element.

In the wavelength conversion device, at least one of the first cooling device and the second cooling device may include a cooling fin.

With this configuration, heat radiation from the condenser of at least one of the first cooling device and the second cooling device can be facilitated by the cooling fin.

An illumination device according to an aspect of the present disclosure includes: a light source configured to emit light having a first wavelength band; and the wavelength conversion device configured to convert a wavelength of the light emitted from the light source into a second wavelength band different from the first wavelength band.

With this configuration, in the illumination device, cooling efficiency is improved with respect to heat generation involved in the conversion of the wavelength of the light emitted from the light source. Deterioration in wavelength conversion efficiency can be suppressed.

A projector according to an aspect of the present disclosure includes: the illumination device; a light modulator configured to modulate light emitted from the illumination device; and a projection optical device configured to project the light modulated by the light modulator.

With this configuration, in the projector, deterioration in wavelength conversion efficiency is suppressed. Illumination efficiency can be stabilized.

The projector may further include a cooling fan configured to blow air to the first cooling device.

With this configuration, the cooling efficiency for the wavelength conversion element is further improved. The illumination efficiency of the projector can be further stabilized.

What is claimed is:

1. A wavelength conversion device comprising:
   a rotating device;
   a substrate including a first surface and a second surface disposed at an opposite side of the first surface, the substrate being rotated by the rotating device;
   a wavelength conversion element provided on the first surface and configured to convert a wavelength of incident light, the wavelength conversion element being in direct contact with the first surface of the substrate; and
   a first cooling device provided on the second surface, the first cooling device including, on an inside, a space in which working fluid is encapsulated, the first cooling device cooling the wavelength conversion element, wherein:
   the first cooling device is disposed in a position corresponding to the wavelength conversion element,
   the space extends from an outer edge side of the substrate to a rotation axis side,
   the first cooling device includes
      a housing configured to form the space in which the working fluid inside is encapsulated,
      an evaporator provided in the space and configured to evaporate the working fluid in a liquid phase with heat transferred from the wavelength conversion element to change the working fluid in the liquid phase to the working fluid in a gas phase, and
      a condenser provided in the space and configured to condense the working fluid in the gas phase to change the working fluid in the gas phase to the working fluid in the liquid phase,
   the evaporator includes a liquid retaining part configured to retain the working fluid in the liquid phase,
   the liquid retaining part is provided at the outer edge side in the space and disposed in the position corresponding to the wavelength conversion element,
   an outer surface of the housing is provided on the second surface of the substrate,
   the wavelength conversion element is separated from the working fluid by the substrate and the outer surface of the housing, and
   the housing is made of a material having thermal conductivity and being different from a material of the substrate.

2. The wavelength conversion device according to claim 1, wherein the first cooling device is provided along a shape of the wavelength conversion element.

3. The wavelength conversion device according to claim 1, wherein the liquid retaining part is not provided at an end portion at the rotation axis side in the space.

4. The wavelength conversion device according to claim 1, wherein:
   a direction from the first surface toward the second surface along the rotation axis is a first direction, the first cooling device includes, in a part located in the first direction, a plurality of fins disposed along a rotating direction of the substrate, and
a plurality of grooves are radially provided in the plurality of fins from the rotation axis side toward the outer edge side.

5. The wavelength conversion device according to claim 1, wherein the first cooling device includes a cooling fin.

6. An illumination device comprising:
a light source configured to emit light having a first wavelength band; and
the wavelength conversion device according to claim 1 configured to convert a wavelength of the light emitted from the light source into a second wavelength band different from the first wavelength band.

7. A projector comprising:
the illumination device according to claim 6;
a light modulator configured to modulate light emitted from the illumination device; and
a projection optical device configured to project the light modulated by the light modulator.

8. The projector according to claim 7, further comprising a cooling fan configured to blow air to the first cooling device.

9. The wavelength conversion device according to claim 1, wherein the material of the substrate is a ceramic, and the material of the housing is copper.

10. A wavelength conversion device comprising:
a rotating device;
a substrate including a first surface and a second surface disposed at an opposite side of the first surface, the substrate being rotated by the rotating device;
a wavelength conversion element provided on the first surface and configured to convert a wavelength of incident light; and
a first cooling device provided on the second surface, the first cooling device including, on an inside, a space in which working fluid is encapsulated, the first cooling device cooling the wavelength conversion element, wherein:
the first cooling device is disposed in a position corresponding to the wavelength conversion element,
the space extends from an outer edge side of the substrate to a rotation axis side,
the first cooling device includes
an evaporator provided in the space and configured to evaporate the working fluid in a liquid phase with heat transferred from the wavelength conversion element to change the working fluid in the liquid phase to the working fluid in a gas phase, and
a condenser provided in the space and configured to condense the working fluid in the gas phase to change the working fluid in the gas phase to the working fluid in the liquid phase,
the evaporator includes a liquid retaining part configured to retain the working fluid in the liquid phase,
the liquid retaining part is provided at the outer edge side in the space and disposed in the position corresponding to the wavelength conversion element,
a direction from the first surface toward the second surface along the rotation axis is a first direction, and
the first cooling device includes, in a part located in the first direction, an inclined surface inclined such that length of the space along the first direction increases from the outer edge side toward the rotation axis side.

11. A wavelength conversion device comprising:
a rotating device;
a substrate including a first surface and a second surface disposed at an opposite side of the first surface, the substrate being rotated by the rotating device;
a wavelength conversion element provided on the first surface and configured to convert a wavelength of incident light; and
a first cooling device provided on the second surface, the first cooling device including, on an inside, a space in which working fluid is encapsulated, the first cooling device cooling the wavelength conversion element, wherein:
the first cooling device is disposed in a position corresponding to the wavelength conversion element,
the space extends from an outer edge side of the substrate to a rotation axis side,
the first cooling device includes
an evaporator provided in the space and configured to evaporate the working fluid in a liquid phase with heat transferred from the wavelength conversion element to change the working fluid in the liquid phase to the working fluid in a gas phase, and
a condenser provided in the space and configured to condense the working fluid in the gas phase to change the working fluid in the gas phase to the working fluid in the liquid phase,
the evaporator includes a liquid retaining part configured to retain the working fluid in the liquid phase,
the liquid retaining part is provided at the outer edge side in the space and disposed in the position corresponding to the wavelength conversion element,
a plurality of the first cooling devices are provided, and
the plurality of first cooling devices respectively extend from the rotation axis side to the outer edge side.

12. The wavelength conversion device according to claim 11, wherein the plurality of first cooling devices are bent.

13. The wavelength conversion device according to claim 11, wherein end portions at the rotation axis side of the plurality of first cooling devices are bent in a direction away from the substrate.

14. The wavelength conversion device according to claim 11, further comprising:
a first heat transfer member coupled to a position corresponding to the evaporators in the plurality of first cooling devices; and
a second heat transfer member coupled to parts at the rotation axis side in the plurality of first cooling devices.

15. The wavelength conversion device according to claim 14, further comprising
a cooling fin disposed in the second heat transfer member.

16. A wavelength conversion device comprising:
a rotating device;
a substrate including a first surface and a second surface disposed at an opposite side of the first surface, the substrate being rotated by the rotating device;
a wavelength conversion element provided on the first surface and configured to convert a wavelength of incident light; and
a first cooling device provided on the second surface, the first cooling device including, on an inside, a space in which working fluid is encapsulated, the first cooling device cooling the wavelength conversion element, wherein:
the first cooling device is disposed in a position corresponding to the wavelength conversion element,
the space extends from an outer edge side of the substrate to a rotation axis side, the first cooling device includes
- an evaporator provided in the space and configured to evaporate the working fluid in a liquid phase with heat transferred from the wavelength conversion element to change the working fluid in the liquid phase to the working fluid in a gas phase, and
- a condenser provided in the space and configured to condense the working fluid in the gas phase to change the working fluid in the gas phase to the working fluid in the liquid phase, the evaporator includes a liquid retaining part configured to retain the working fluid in the liquid phase, the liquid retaining part is provided at the outer edge side in the space and disposed in the position corresponding to the wavelength conversion element, a second cooling device provided on the first surface, the second cooling device including, on an inside, a space in which the working fluid is encapsulated, the second cooling device includes
- an evaporator provided in the space and configured to evaporate the working fluid in the liquid phase with the heat transferred from the wavelength conversion element to change the working fluid in the liquid phase to the working fluid in the gas phase, and
- a condenser provided in the space and configured to condense the working fluid in the gas phase to change the working fluid in the gas phase to the working fluid in the liquid phase, and the second cooling device is disposed such that the evaporator of the second cooling device corresponds to a part at the rotation axis side of the first cooling device.

17. The wavelength conversion device according to claim 16, wherein the second cooling device is disposed at the rotation axis side with respect to the wavelength conversion element.

18. The wavelength conversion device according to claim 16, wherein at least one of the first cooling device and the second cooling device includes a cooling fin.

* * * * *